United States Patent [19]
Farr

[11] Patent Number: 5,088,081
[45] Date of Patent: Feb. 11, 1992

[54] METHOD AND APPARATUS FOR IMPROVED DISK ACCESS

[75] Inventor: William Farr, Framingham, Mass.

[73] Assignee: Prime Computer, Inc., Natick, Mass.

[21] Appl. No.: 500,729

[22] Filed: Mar. 28, 1990

[51] Int. Cl.[5] ............................. G11B 7/00; G11B 5/09
[52] U.S. Cl. .............................. 369/54; 369/59; 369/58; 360/24; 360/47
[58] Field of Search ............ 371/2.2, 10.2, 10.1; 369/54, 58, 59; 360/22, 24, 27, 47

[56] References Cited

U.S. PATENT DOCUMENTS

| | | | |
|---|---|---|---|
| 4,817,035 | 3/1989 | Timsit | 364/900 |
| 4,849,978 | 7/1989 | Dishon et al. | 371/10.1 |
| 4,903,198 | 2/1990 | Iwasaki | 371/10.2 |
| 4,914,656 | 4/1990 | Dunphy, Jr. et al. | 371/10.2 |

OTHER PUBLICATIONS

A Case For Redundant Arrays of Inexpensive Disks (RAID), by David A. Patterson, Garth Gibson, and Randy H. Katz, Report No. UCB/CSD 87/891, Dec. 1987, Computer Science Division (EECS), Berkeley, California 94720.

*Primary Examiner*—Roy N. Envall, Jr.
*Assistant Examiner*—Nakil Hindi
*Attorney, Agent, or Firm*—Wolf, Greenfield & Sacks

[57] ABSTRACT

In a RAID level 5 disk drive subsystem, one or more additional disk drives, called "reserve" disks are intercoupled to the array of disk drives and a control system is included for storing recovered digital data on the additional disk drive if a sector on one of the disk drives becomes defective. The system reduces the number of disk accesses required to obtain the information stored on the defective sector. Once the information has been recovered, it is then stored on the "reserve" disk. Thereafter, whenever this information is required, the system reads the required information from the "reserve" disk, instead of going through an entire recovery process for the defective sector. Since the recovery process can take a time that is greater than several disk access times, the present invention improves the speed and the availability of data. In another embodiment of the invention, a bitmap memory is used wherein bits in the bitmap memory representing sectors may be set to indicate whether or not sectors are defective. In a further embodiment of the invention, a disk drive tester, which can be embodied in either hardware or software, is incorporated into the apparatus for periodically testing the "reserve" disk.

19 Claims, 11 Drawing Sheets

METHOD AND APPARATUS FOR IMPROVED DISK ACCESS

BACKGROUND OF THE INVENTION

1. Field of the Invention

The present invention relates generally to the field of storage devices used for storing digital data for a variety of applications. More particularly, the present invention relates to a system for improving the reliability of and the access time to data stored in an array of disk drives.

2. Discussion of the Prior Art

In recent years, central processing unit speed and main memory speed of digital computers has increased tremendously. However, during the same period, the speed of secondary memory devices, such as disk drives, has not kept pace with the increase in speed of other parts of computer hardware. In order to allow secondary memory devices, such as disk drives, to keep pace with improvements in other computer hardware, in terms of both the capacity of disk drives to store data and the speed with which the data can be extracted from the disk drives, the prior art has proposed the use of arrays of disk drives. For example, the paper *A Case For Redundant Arrays Of Inexpensive Disks*, by Patterson, Gibson, and Katz, published in December, 1987, describes several ways that redundant disks have been used in the past to improve the cost and performance of disk drives. Additionally, the Patterson et al. paper describes ways that redundant disks have been used in the prior art to improve the availability of data from a disk drive array. The Patterson et.al. paper classifies the techniques used to improve disk drive performance into levels of RAID (an acronym for Redundant Arrays of Inexpensive Disks). Patterson et.al. present a taxonomy of RAID levels 1-5. The most advanced level of RAID, level 5, uses a number of disks to store a combination of data and redundant information. The redundant information allows reconstruction of the data on any sector on the disk drive should that sector become defective. By distributing the data and redundant information across all the disks in the array, RAID level 5 improves the performance of read modify write operations using small amounts of data and data transfer operations using large amounts of data. The useful storage capacity as a percentage of the total disk drive array storage capacity is also increased.

All of the RAID systems (levels 1-5) described in the Patterson et.al. paper use a data recovery method that combines the redundant data including the check data and parity data from each of the disks in the array in order to reconstruct the data from a defective sector on a disk. However, the recovery process adds significant time to the data access time for data from a defective disk sector within the array. Each time the defective sector is accessed, the recovery process which may take more time than the time required for several disk accesses, must be performed. Eventually, one or more of the disks in the array will have a high enough error rate to require replacement of the defective disks for performance or data availability reasons. While the defective disk or disks are being replaced, the data in the disk array is either completely unavailable to the system or the data rate of the disk array is very low because of the high number of disk accesses and processing time that is required to read and copy the good data from the malfunctioning disk plus all of the reconstructed data (recovered by the recovery process) to the new disk drive. "Re-silvering," the term for the process of writing the data to the new disk drive, is time consuming and computationally intensive.

Therefore, an object of the present invention is to provide a method and apparatus for improving data availability and reliability in a disk drive array.

A further object of the present invention is to provide a method and apparatus for transferring data from a malfunctioning disk to a new disk drive in a disk drive array.

Another object of the present invention is to provide a method and apparatus for decreasing the access time to the data on subsequent disk accesses after the data has been recovered once from a malfunctioning disk drive.

Still another object of the present invention is to provide a method and apparatus for decreasing the time needed to re-silver a new disk when the new disk is added to a disk drive array.

Still another object of the present invention is to provide a method and apparatus for increasing disk drive array performance and reliability at low cost.

Yet another object of the present invention is to provide a method for improving data access and reliability that can be practiced in either computer hardware or computer software.

SUMMARY OF THE INVENTION

The foregoing and other objects and advantages of the present invention are achieved in one embodiment of the invention in a RAID level 5 disk drive subsystem in which one or more additional disk drives, hereinafter called "reserve" disks, are intercoupled to the array of disk drives and control means is included for storing recovered digital data on the additional disk drive if a sector on one of the disk drives becomes defective. The system thus reduces the number of disk accesses required to obtain the information stored on the defective sector. Once the information has been recovered, it is then stored on the "reserve" disk. Thereafter, whenever this information is required again, the system merely reads the required information from the "reserve" disk, instead of having to go through an entire recovery process for the defective sector for every access. Since the recovery process can take a time that is greater than several disk access times, the present invention improves the speed and the availability of data.

In another embodiment of the invention, a bitmap memory is used wherein each bit in the bitmap memory corresponds to a particular sector in the disk drive array. The bits can then be set to indicate whether or not sectors are defective. Since the access time for electronic memories, such as random access memories, is much faster than the access time for disk drives, the performance of the present invention can be further improved by first accessing the bitmap memory to determine whether or not a sector is defective. If the bitmap memory indicates that the sector is defective, the data of interest can then be read directly from the "reserve" disk thereby bypassing the time and disk accesses required in order to check the defective sector by reading the sector on the original disk.

In another embodiment of the invention, a disk drive tester, which can be embodied in either hardware or software, is incorporated into the apparatus for periodically testing the "reserve" disk thus ensuring that when the "reserve" disk is needed, it will be available and operational.

The re silvering time required when a disk drive in the disk array is to be replaced is also reduced because the data has been gradually recovered and stored onto the "reserve" disk as another disk(s) in the array exhibits an increasing number of defective sectors.

The present invention is also applicable to other digital data storage systems which use a variety of storage devices for a wide variety of applications, such as optical disks, magnetic tape storage, etc.

The foregoing and other objects, features, and advantages of the present invention will be more readily understood and apparent from the following detailed description of the invention, which should be read in conjunction with the accompanying drawings, and from the claims which are appended at the end of the detailed description.

DETAILED DESCRIPTION

For purposes of illustration only, and not to limit generality, the present invention will now be described with reference to its use in a disk drive array organized as a RAID level 5 disk subsystem. However, one skilled in the art will recognize that the method and apparatus of the present invention may be used in storage systems which use different types of storage devices, different numbers of storage devices and different data organizations.

Figure 1:
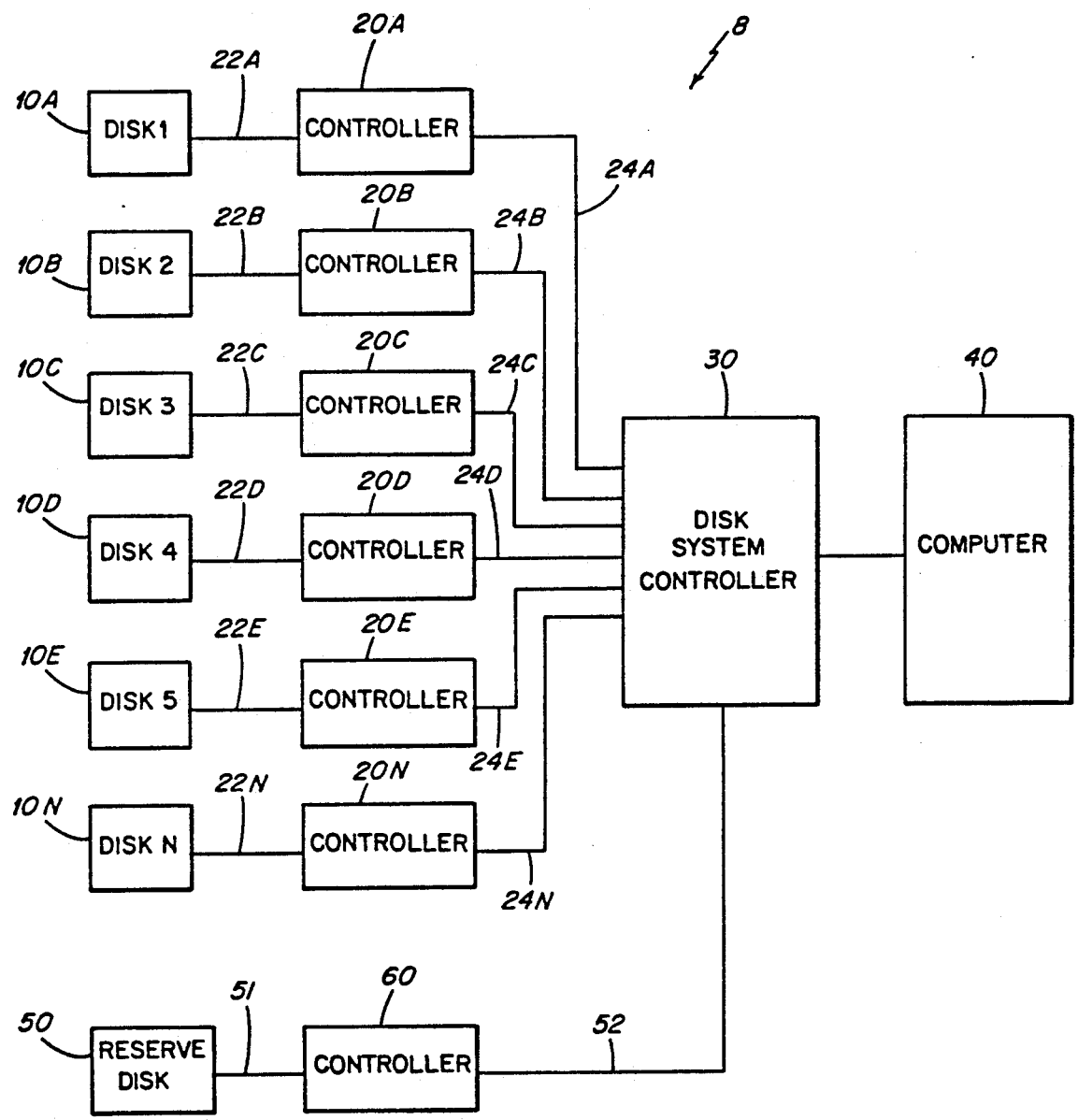
FIG. 1 is a schematic block diagram of an illustrative embodiment of the present invention, showing a disk drive array with an additional "reserve" disk.

FIG. 1 illustrates, in schematic block diagram form, a disk drive array subsystem 8 organized in the RAID level 5 fashion as described in the Patterson et.al. paper. The disk subsystem usually, but not necessarily, includes a number of identical disk drives 10A-10N which may be connected to its own separate disk drive controller 20A-20N via data, power, and control of the individual disk drives for mechanical functions such as disk speed and disk head control, as well as providing data management functions such as data buffering. These controllers may be incorporated into the disk drives or may be combined into one controller for all of the disk drives. The number of disks in the disk subsystem is limited only by the amount of data storage required.

Each of the disk controllers 20 is connected to the disk subsystem controller 30 via cables 24A-24N. The disk subsystem controller 30 provides the interface between the computer system and the array of disks. The disk subsystem controller provides data management, error handling, and data buffering. The disk subsystem controller is connected to the computer 40 at the computer's memory bus, input/output bus, or any other convenient point depending on the computer system and software architecture.

The disk subsystem of FIG. 1 also contains an additional "reserve" disk 50 connected to associated controller 60 via cable 51. Controller 60 is connected to the disk subsystem controller via cable 52. There may be as many "reserve" disks and controllers in the system as the user desires. The function of the "reserve" disks, which will be explained in greater detail hereinafter, is to gradually replace the storage capacity of a failing disk in the disk array, as the number of errors on the failing disk increases.

Figure 2:
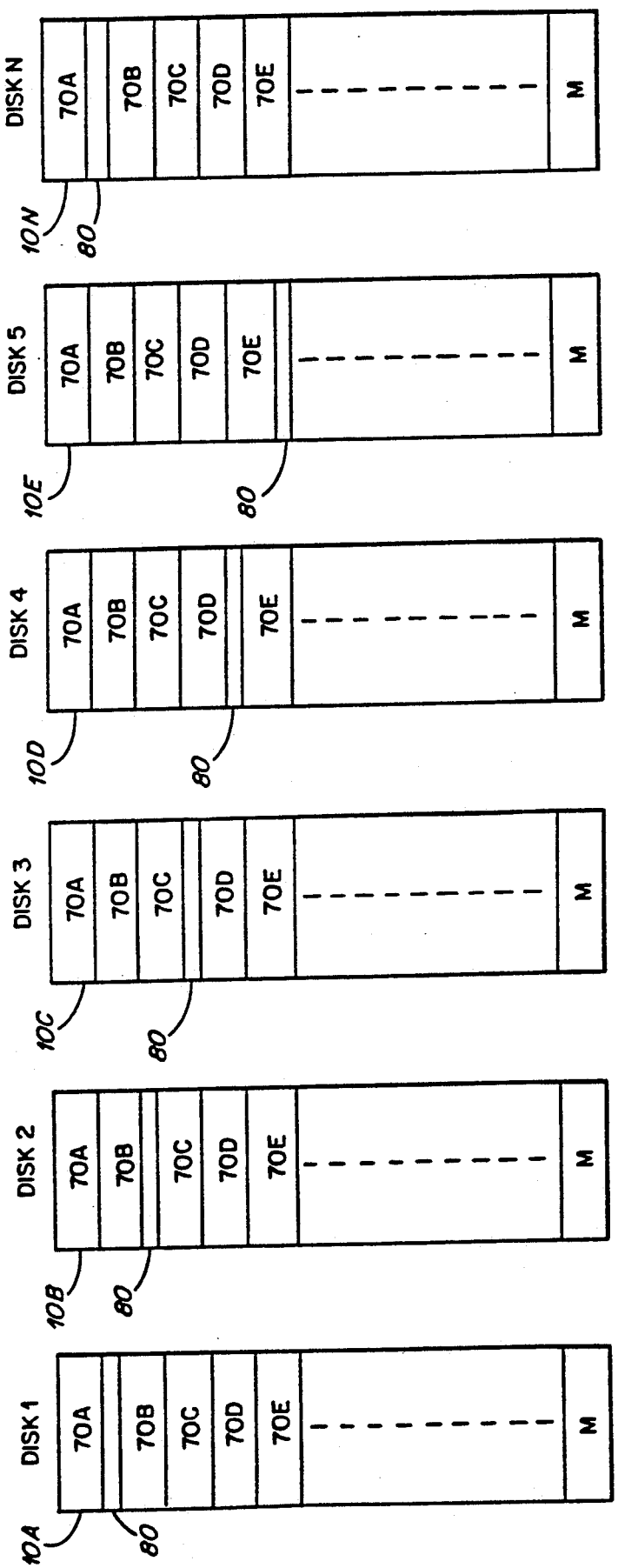
FIG. 2 is an illustrative data organization of the data stored in the disk drive array of FIG. 1.

FIG. 2 shows an illustration of an exemplary data organization for the storage of data in the disk subsystem of FIG. 1. Each of the disks 10, has a number of typically identical sectors 70A-70M containing a specific amount of data. The number of sectors on a disk drive depends on the storage capacity of the particular disk drive. Each of the sectors 70 stores a portion of the total data that is to be stored on the disk drive. In addition to the data stored within the sectors 70, there is also provided on each disk at least one smaller storage area 80 which stores redundancy information including parity and check data. Whenever an error is detected during a disk read in a RAID level 5 disk array, the data that was stored on the sector experiencing the error can be recovered by reading all of the related redundant data stored in each of the additional storage areas 80. This additional data can be then used (by many well-known techniques) to reconstruct the data that was stored in the sector which experienced the error. Without this invention, such a recovery process would be required every time that the sector that has the error is accessed. Recalculating the data from a bad sector every time that data was accessed can significantly lower the data rate and performance of the disk subsystem. Further, as the number of bad sectors increases over the life of the disk drive, an increasing number of recalculations will be required in order to recover the data from the increasing number of bad disk sectors. At some point in time, the number of bad sectors on a disk may exceed a threshold at which either the data rate that the disk subsystem can sustain will be extremely low, or the data from the bad disk can no longer be recalculated because sufficient numbers of sectors on the disk containing the redundant information have become defective.

In order to solve this problem, the present invention provides an additional disk 50 and controller 60 as shown in FIG. 1. Whenever the number of errors detected by the disk subsystem controller 30 is greater than a predetermined threshold, the present invention writes the recovered data to the "reserve" disk 50 instead of attempting to store the recovered data back on the disk which had the bad sector. The system of the present invention requires one extra disk access to write the data the first time that the data is recovered and written to the "reserve" disk. Thereafter, however, any time the disk sector that had the error is read, the data is read from the "reserve" disk instead. Thus, the method and apparatus of the present invention saves the disk access time as well as the recalculation and recomputation time needed to recover the data. The amount of time required for each recovery and recalculation of the data in a bad sector can be on the order of one or more disk access times. Therefore, the present invention significantly improves data availability and data integrity in the disk array.

As shown in FIG. 2, an additional "reserve" disk 50, which may be a disk identical to disks 1—N is added to the system. The disk typically has a similar data structure to disks 1—N. In the example shown in FIG. 2, the first sector 51 of "reserve" disk 50 contains the data that would normally be stored on disk 1, sector 70B. In the above example, sector 70B of disk 1 is defective and therefore, whenever the system requires data from the sector, the system proceeds to the "reserve" disk and reads the required data directly from sector 51. Consequently, the system does not have to attempt to reconstruct the data that would normally be stored on disk 1 sector 70B, since that data is already available on "reserve" disk 50, sector 51.

Figure 3:
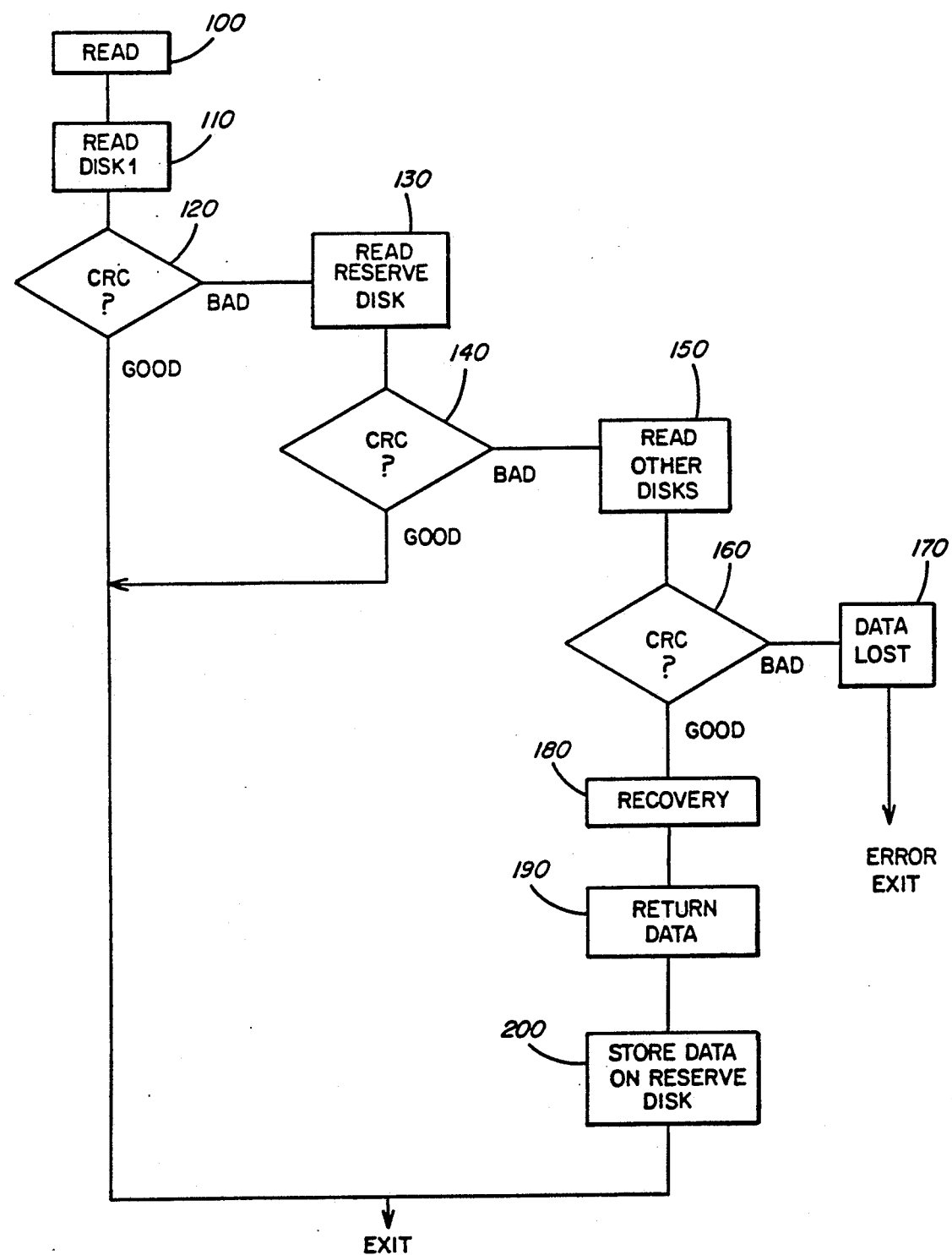
FIG. 3 is a flow chart illustrating the method of the present invention for performing a disk read with a "reserve" disk in the apparatus of FIG. 1.
Figure 4A:
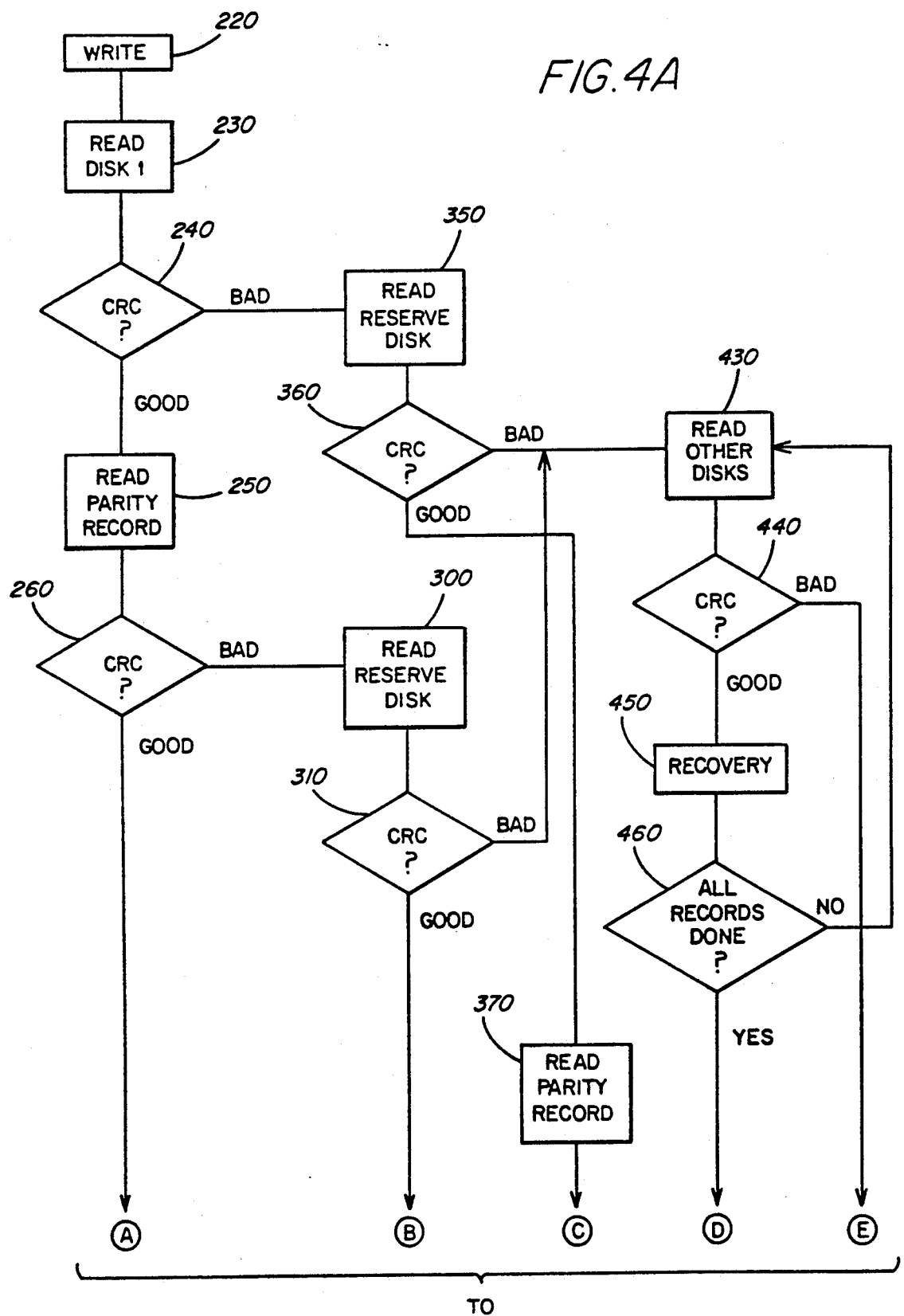
FIGS. 4A and 4B together are a flow chart illustrating the method of the present invention for performing a disk write with a "reserve" disk in the apparatus of FIG. 1.
Figure 4B:
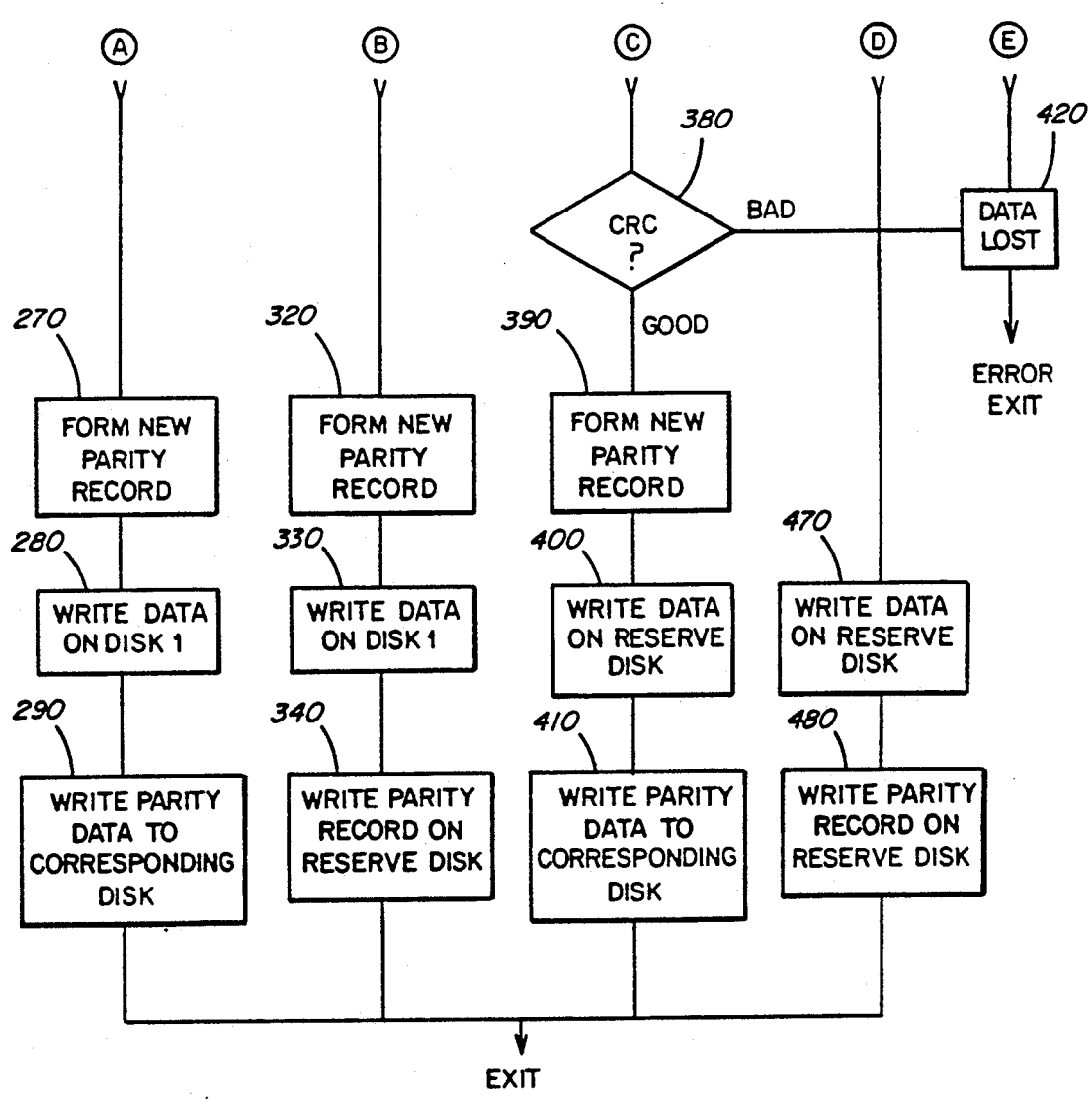
Figure 5A:
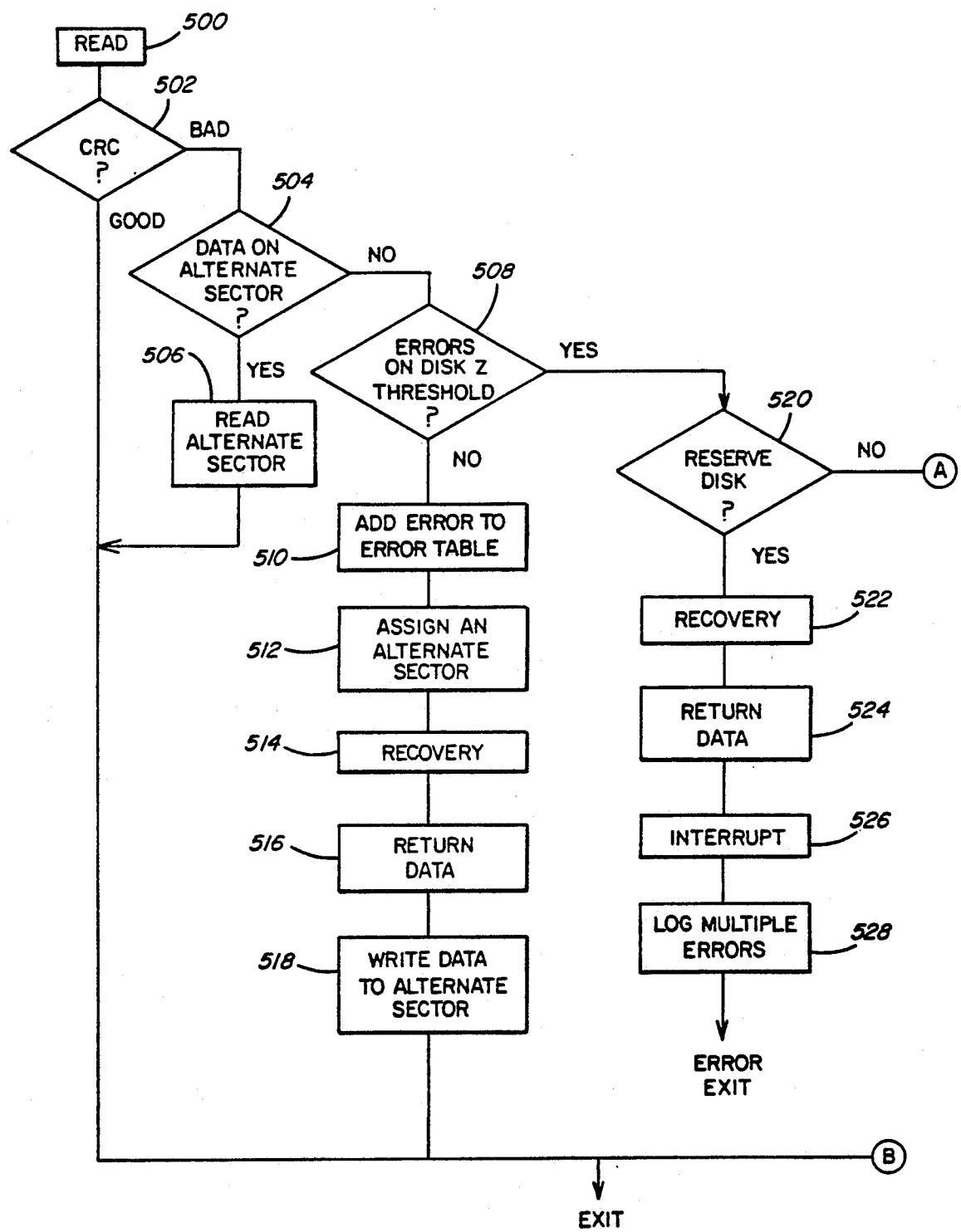
FIGS. 5A and 5B together are a flow chart illustrating the method of the present invention for performing a disk read when a technique known as "alternate sectors" is used for error handling with a "reserve" disk in the system of FIG. 1.
Figure 5B:
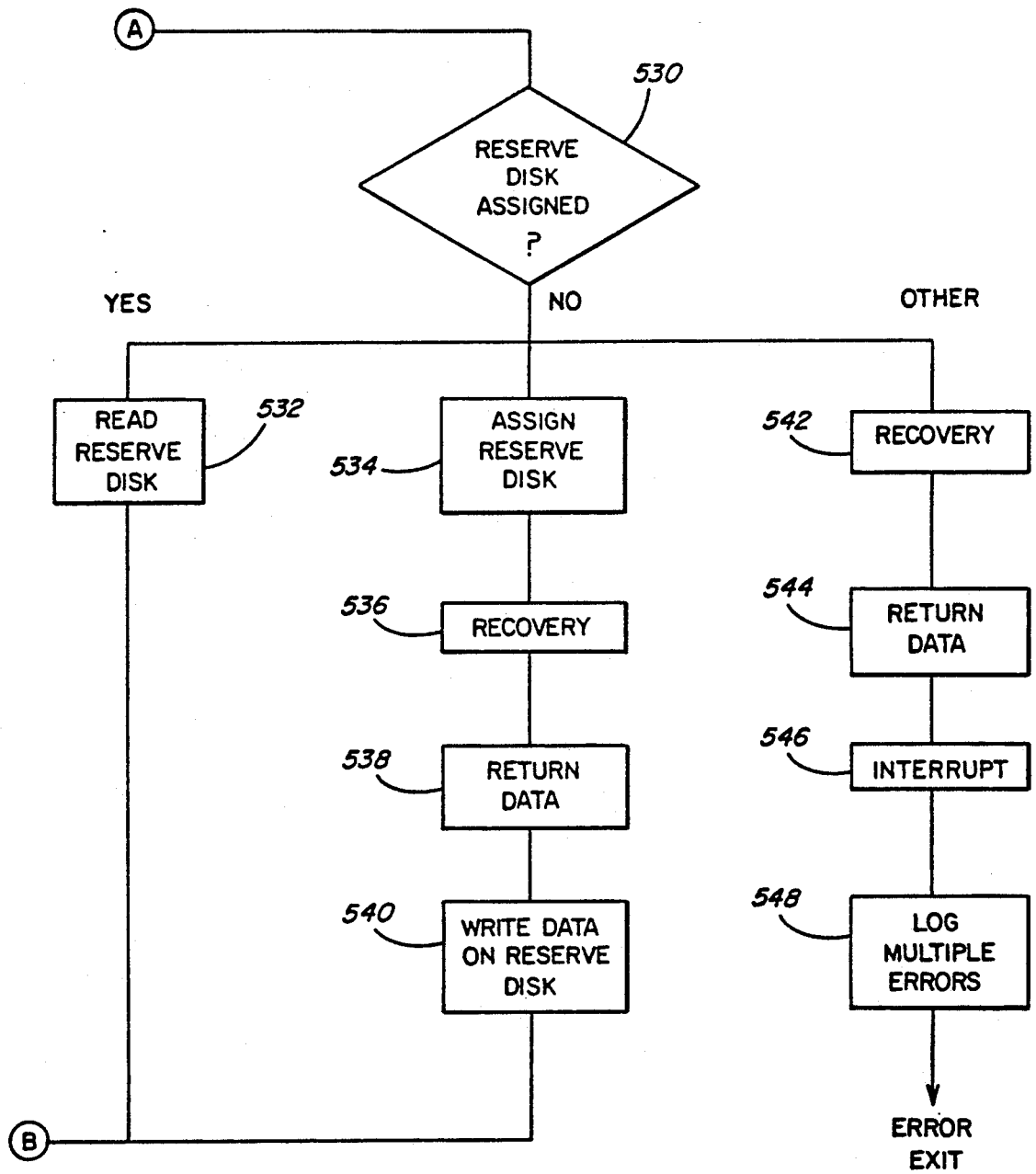

Reference is now made to FIG. 3 to illustrate how the method and apparatus of the present invention operates to read a data record from a disk in a RAID 5 disk array containing at least one additional "reserve" disk. Before a "reserve" disk is placed into service, it must be initialized in a manner which allows the system to know whether the data in each disk sector has been written with valid data. In one embodiment of the invention, this is accomplished by initializing the "reserve" disk to have bad CRC's in every disk sector. In another embodiment of the invention, initialization may be accomplished using bitmaps as explained in greater detail later on. In step 100, the computer system requests a data record from a disk in the disk drive array. In step 110, the system reads a disk record, in this example, on disk number one, in order to retrieve the requested data. The system then proceeds to step 120 in which a cyclic redundancy check (CRC), or other type of check, which is well known in the art, is performed in order to determine whether or not the data read from the disk is good.

If the answer is step 120 is yes, that is, the CRC check indicates that the data has been read from the disk correctly, then the routine ends. If, on the other hand, in step 120, the CRC check had determined that the data read from disk number one was bad, the system proceeds to step 130, in which the "reserve" disk is read in order to attempt to retrieve the requested data. The system then proceeds to step 140 in which a CRC check is made to determine whether or not the data read from the "reserve" disk is good or not written with valid data yet.

If the answer in step 140 is yes, that is, the data read from the "reserve" disk is good, then the routine ends. Reading the data from the "reserve" disk if the original disk has a bad sector requires one additional disk access. However, the extra time required for the additional disk accesses is significantly less than the time needed to recover the data by a conventional reconstruction method.

On the other hand, if the CRC check in step 140 indicated that the data read from the "reserve" disk was bad, then the requested data is not available on the "reserve" disk. This can mean that the record is indeed bad or that the "reserve" disk record has not yet been written as will occur the first time that an error is detected. In either case, the system proceeds to step 150. In step 150, the system reads all of the other related redundancy and parity areas on all of the other disks as shown in FIG. 2 in order to try to reconstruct the requested data. Next, the system proceeds to step 160 in which a CRC check is made to determine whether or not any of the data read from the other disks' redundancy and parity areas is bad. If any of the CRC checks fail, the system proceeds to step 170 in which a message is returned to the computer system indicating that the data has been lost.

On the other hand, if the answer in step 160 is yes, that is, all the CRC checks determined that the data read from all the related redundancy and parity areas of all of the other disks in the array were good, the system proceeds to step 180. In step 180, the system performs a recovery and recalculation operation such as performing an EXCLUSIVE OR (XOR) function on all of the data read from all of the redundancy and parity areas 80 in the disk array of FIG. 2. The system then proceeds to step 190 in which the data requested is sent to the computer system. Finally, in step 200, the system writes the recovered data to the "reserve" disk.

Thereafter, when this same data is requested by the computer system, the disk subsystem will only have to perform two disk accesses (steps 110 and 130) in order to read the required data. On the other hand, if the "reserve" disk was not in the system, the disk subsystem would have to perform steps 150–190 every time the data on the bad sector of disk number one was requested. This would require N+3 disk accesses where N is the number of disks in the array, each time the data requested from the bad sector on disk number one was requested. Consequently, the present invention reduces the number of disk accesses required by N+1 after the data has been recovered the first time as well as the computation time to correct the error. This is a significant performance improvement since the EXCLUSIVE OR time required to perform step 180 may be on the order of one or more disk access times.

Referring now to FIG. 4, the present invention will now be explained for the case where the computer system is to store (write) data on a disk in a RAID level 5 disk array. Even if there are no errors, a write data operation in a RAID level 5 disk array requires four disk accesses—two reads and two writes of the data and parity records. In step 220, the computer system begins a write sequence to the disk drive array. Next, in step 230, the system reads a data record from a disk in the array, such as disk number one (illustrated in FIGS. 1 and 2). The system then proceeds to step 240 in which a check such as a CRC check is performed to determine whether any of the data read from the disk drive in step 230 is bad. If the answer in step 240 indicates that the data record read from the disk drive number one is good, the system proceeds to step 250 in which data is written on disk number one. From step 250, the system proceeds to step 260 in which the corresponding parity record from the corresponding parity disk is read. From step 260, the system proceeds to step 270 in which a CRC check is performed to determine if any of the data read from the parity disk in step 260 is bad. If the CRC check in step 270 indicates that the parity record read from the parity disk is good, the system proceeds to step 280. In step 280, a new parity data record is formed using a technique such as EXCLUSIVE ORING. The new parity data is formed by performing an EXCLUSIVE OR function on the data read from the disk drive in step number 230 with the data that the computer system is going to store (write) on the disk drive. The result of this operation is then EXCLUSIVE ORED with the old parity data that was read in step 260. From step 280, the system proceeds to step 290 in which the newly computed parity data record is written to the corresponding parity disk completing the write operation if no errors were detected.

Returning to step 270, if the CRC check had indicated that the data read from the parity disk in step 260 was bad, then a situation exists in which the data record is good (having been read correctly in step 230) and the parity record is ba (having been read incorrectly in step 260). The system proceeds to step 300 in which an attempt is made to read the "reserve" disk in order to obtain the parity data. From step 300, the system proceeds to step 310 in which a CRC check is performed to determine whether or not any of the data read from the disk drive in step 300 is either bad or not yet written to the "reserve" disk. If the CRC check indicates that the data read in step 300 is good, the system proceeds to step 320 in which it performs an EXCLUSIVE OR function in order to form a new parity record. In step 320, the system EXCLUSIVE ORS the data read from the disk drive in step 230 with the new data to be written to the disk drive. The system then EXCLUSIVE ORs the result with the parity data read from the "reserve" disk in step 300. From step 320, the system proceeds to step 330 in which the newly computed parity record that was formed in step 320 is written to the "reserve" disk completing the write operation.

Returning to step 310, if the parity information is read from the array disk drive with an incorrect CRC check (in step 260) and the parity information is then read from the "reserve" disk with an incorrect CRC check (steps 260, 270, 300, 310) the system proceeds to step 480. In steps 480, 482, and 484, all of the corresponding parity records must be read correctly in order to correct the parity information that is in error. From step 480, the system proceeds to step 482 in which a CRC check is performed on each of the data records read in step 480 to determine if any of the data records are in error. If any of the data records have errors, the data cannot be recalculated and the system proceeds to step 420 in which a message indicating that the data has been lost is transmitted to the computer system.

If, on the other hand, all the CRC checks performed in step 482 indicate that all of the data records read in step 480 were correct, as determined in step 484, the system proceeds to step 486. In step 486, the data record or the parity information is recomputed using a technique such as EXCLUSIVE ORING all of the data records read in step 480 together in order to reconstruct the data. From step 486, the system proceeds to step 320. In steps 320 and 330, the new parity record is formed and written to the "reserve" disk as previously described thus completing the write operation.

Returning to step 240, if the CRC check indicates that the data read in step 230 is bad, the system proceeds to step 350 in which an attempt is made to read the "reserve" disk in order to obtain the data. From step 350, the system proceeds to step 360 in which a CRC check is performed on the data read in step 350. If the CRC check indicates that the data read in step 350 is good, the system proceeds to step 400 in which the data to be stored is written to a data record on the "reserve" disk.

From step 400, the system proceeds to step 260 and processing continues as already previously described.

Returning to step 360, if the data is read from the disk drive with an incorrect CRC check and the data is then read from the "reserve" disk with an incorrect CRC check (steps 230, 240, 350, 360) indicating that either the reserve disk has not been written yet or the data record was indeed bad, the system proceeds to step 430. In step 430, all of the corresponding array data records must be read in order to correct the data record that is in error. From step 430, the system proceeds to step 440 in which a CRC check is performed on each of the data records read in step 430 to determine if any of the data records are in error. If any of the data records have errors, the data can not be recalculated using this technique and the system proceeds to step 420 in which a message indicating that the data has been lost is posted to the system.

If, on the other hand, all the CRC checks performed in step 440 indicate that all of the data records read in step 430 are correct, the system proceeds to step 450. In step 450, a check is made to determine that all of the necessary related data records have been read. If step 450 indicates that a data record has not been operated on, the system loops back to step 430 and processing continues as already previously described. If, on the other hand, the answer in step 450 indicates that all data records have been operated upon, the system proceeds to step 460.

In step 460 the data record is recomputed using a technique such as EXCLUSIVE ORING all of the data records read in step 430 together in order to reconstruct the data. From step 460, the system proceeds to step 400. In step 400, the system writes the reconstructed data record to the "reserve" disk. From step 400, the system proceeds to step 260 and processing continues as already previously described.

In the system illustrated in FIG. 4, if both the data record and the parity record are read correctly from the disk in the array, the number of disk accesses required to perform a write operation is 4. On the other hand, if either the data record or the parity record has an error in it and has to be reconstructed by the system, the number of disk accesses will be N+4 where N represents the number of disks in the array. This is a consequence of the fact that the system has to read the parity and check data from every other disk in the array in order to reconstruct the data that was in error. Without the present invention, every time this data stored on a defective disk sector was required by the system, the system would have to completely reconstruct the data from all of the parity and check data areas. On the other hand, in the present invention, once the data has been reconstructed once, it is stored on the "reserve" disk. Consequently, once the data is stored on the "reserve" disk, only one extra disk access is required to read either the data or parity information from the "reserve" disk. This saves N−1 disk accesses plus the time that it takes to reconstruct the data. This is a particular advantage in an array of disks because the time that the system requires in order to reconstruct the data in error can be on the order of several disk accesses. Consequently, the present invention saves a considerable amount of time once the data has been reconstructed and stored on the "reserve" disk.

Reference is now made to FIG. 5 which depicts a flow chart showing how the system of the present invention works during a read operation in conjunction with the disk storage subsystem error handling technique known as "alternate sectors" to store data that would otherwise be written in defective disk sectors. That is, if more errors occur than a predetermined threshold" number or more than can be accommodated by the assigned alternate sectors in the array of disks, then a "reserve" disk is assigned to hold the error data for that disk and is used for the overflow alternate sectors for that disk from then on.

Alternate sectors are known to those skilled in the art and are used as a way of allowing less than perfect disk surfaces to be used. If, during the manufacturing or testing process, a disk sector is defective because of media defects, an "alternate" or spare sector is assigned to be used instead of the original physical sector. This is typically done during final test of the disk and a table of bad sectors is written on the disk and the "alternate" assigned physical sector addresses are also written either many times (redundantly) in the bad sector itself or in a table. The system can thus read the list of bad sectors and the alternate sector assignments. If enough bad sectors are found, and there are not enough alternate sectors reserved on the disk to hold the data that would normally be stored in the defective sectors, the disk platter is rejected as defective. This "alternate" sector assignment process can be extended to an operating disk system and as records are found to be defective, "alternate" (spare) sectors are assigned to receive the defective sector s data. This is useful if few records become defective during operation. However, if this happens, that is, sectors are found to be defective during operation that were not found defective during manufacturing testing, this may be an early sign that the disk has a problem. Thus, the "reserve" disk may be used in this instance to avoid both unnecessary access to alternate sectors or on the assumption that if a certain number (hereinafter called the "threshold" number) of new alternate sectors are required, then the disk may be beginning to go bad and the "reserve" disk should be used instead of assigning new alternate sectors on the array disk so that possible future recovery operations and extra disk accesses may avoided. The flow chart of FIG. 5 shows that the present invention can be used with, and extends to, systems that use "alternate" sector error handling schemes.

Referring now to FIG. 5, in step 500, the system initiates the read operation. From step 500, the system proceeds to step 502 in which a CRC check is made to determine whether or not the data read in step 500 is good. If the answer in step 502 is yes, that is, all of the data is good, then the system exits the routine in a normal fashion. If on the other hand, the answer in step 502 indicates that the data read in step 500 is bad, then the system proceeds to step 504. In step 504, the system checks to see whether the data requested has been stored on an alternate sector on the disk drive. If the answer in step 504 is yes, the system then reads the alternate sector in step 506 and proceeds to step 507. In step 507, the system performs a CRC check to determine whether or not the data read in step 506 is good. If the answer in step 507 indicates that the data read in step 506 is bad, the system proceeds to step 508. If, on the other hand, the answer in step 507 indicates that the data read in step 506 is good, the system delivers the data to the computer system and the routine ends in a normal fashion.

If the system detects a CRC error in step 507 or the answer in step 504 is no, indicating that the data requested is not on an alternate sector and is therefore a newly discovered error, the system proceeds to step 508. In step 508, the system compares the number of errors on the disk with a predetermined threshold number. If the number of errors on the disk is less than the predetermined threshold number, the system proceeds to step 510. In step 510, the system adds this error to the error table so that when this particular data is requested again, the system will be programmed to recover the data from an alternate sector. From step 510, the system proceeds to step 512 in which an alternate sector from the original array disk is assigned for storage of the particular data. From step 512, the system proceeds to step 514 in which the data is then recovered in the normal fashion by reading all of the other disks in the array in order to obtain the parity and redundancy information and then performing an EXCLUSIVE OR function in order to reconstruct the data. Next, in step 516, the reconstructed data is transmitted to the computer system that originally requested the data. From step 516, the system proceeds to step 518 in which the now reconstructed data is written onto the alternate sector for future use.

Returning to step 508, if the number of errors on the disk had been greater than the predetermined threshold, the system proceeds to step 520. In step 520, the system determines whether or not the disk that is experiencing the errors is already a "reserve" disk. If the answer is yes in step 520, the system proceeds to step 522 in which the system attempts to recover the data in the normal fashion by reading all of the data from the redundancy and parity areas on all of the other disks in the array and then performing an EXCLUSIVE OR function. From step 522, the system proceeds to step 524 in which the data is transmitted to the computer system if the recovery was successful. From step 524, the system proceeds to step 526. In step 526, an interrupt is generated in order to alert the user that the "reserve" disk has experienced an error. From step 526, the system proceeds to step 528 in which this additional disk error is logged. The frequency of disk errors of this sort may, at some point, for performance or data reliability reasons, force re silvering and disk replacement.

Returning to step 520, if the system determines that the disk experiencing errors is not a "reserve" disk, the system proceeds to step 530. In step 530, the system determines whether or not a "reserve" disk has been assigned to store the data if the number of errors exceeds the predetermined threshold number. If the answer in step 530 is yes, indicating that there is a "reserve" disk assigned, then the system proceeds to step 532 in which the data is read from the "reserve" disk. After step 532, a CRC check is performed in step 533. If the CRC check is good, the routine ends in the normal fashion. If the CRC check is bad, the system returns to step 522 and processing continues as already previously described.

Returning to step 530, if the system determines that a "reserve" disk has not been assigned to the particular disk experiencing errors, the system proceeds to step 534. In step 534, the "reserve" disk is assigned to the disk experiencing errors. From step 534, the system proceeds to step 536 in which the originally requested data is then recovered in the normal fashion as previously described. From step 536, the system proceeds to step 538 in which the data is transmitted to the computer system. From step 538, the system proceeds to step 540 in which the newly reconstructed data is written to the "reserve" disk so that when the computer system accesses this data again it will be immediately available on the "reserve" disk.

Finally, in step 530, the system additionally checks for the situation in which there is no "reserve" disk assigned to the disk experiencing errors, and there is no "reserve" disk to be assigned. If this is the situation, the system proceeds to step 542. In step 542, a recovery process as already described is carried out in order to recover the requested data. From step 542, the system proceeds to step 544 in which the recovered data is transmitted to the computer system. From step 544, the system proceeds to step 546 in which an interrupt is generated indicating that the system is experiencing data errors and that a new "reserve" disk should be added to the system. From step 546, the system proceeds to step 548 in which the same processing as described in connection with step 528 is carried out. After step 548, the program exits and reports the data error.

The two read operations performed during a RAID level 5 write operation with alternate sector handling are performed in the same manner as the read operations described above.

Figure 6:
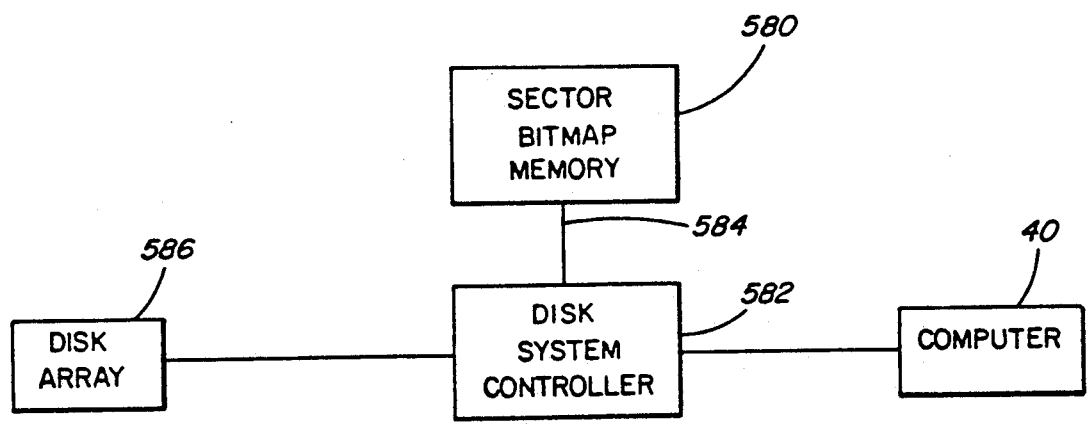
FIG. 6 is a schematic block diagram showing an additional sector bitmap for the apparatus of FIG. 1.
Figure 7A:
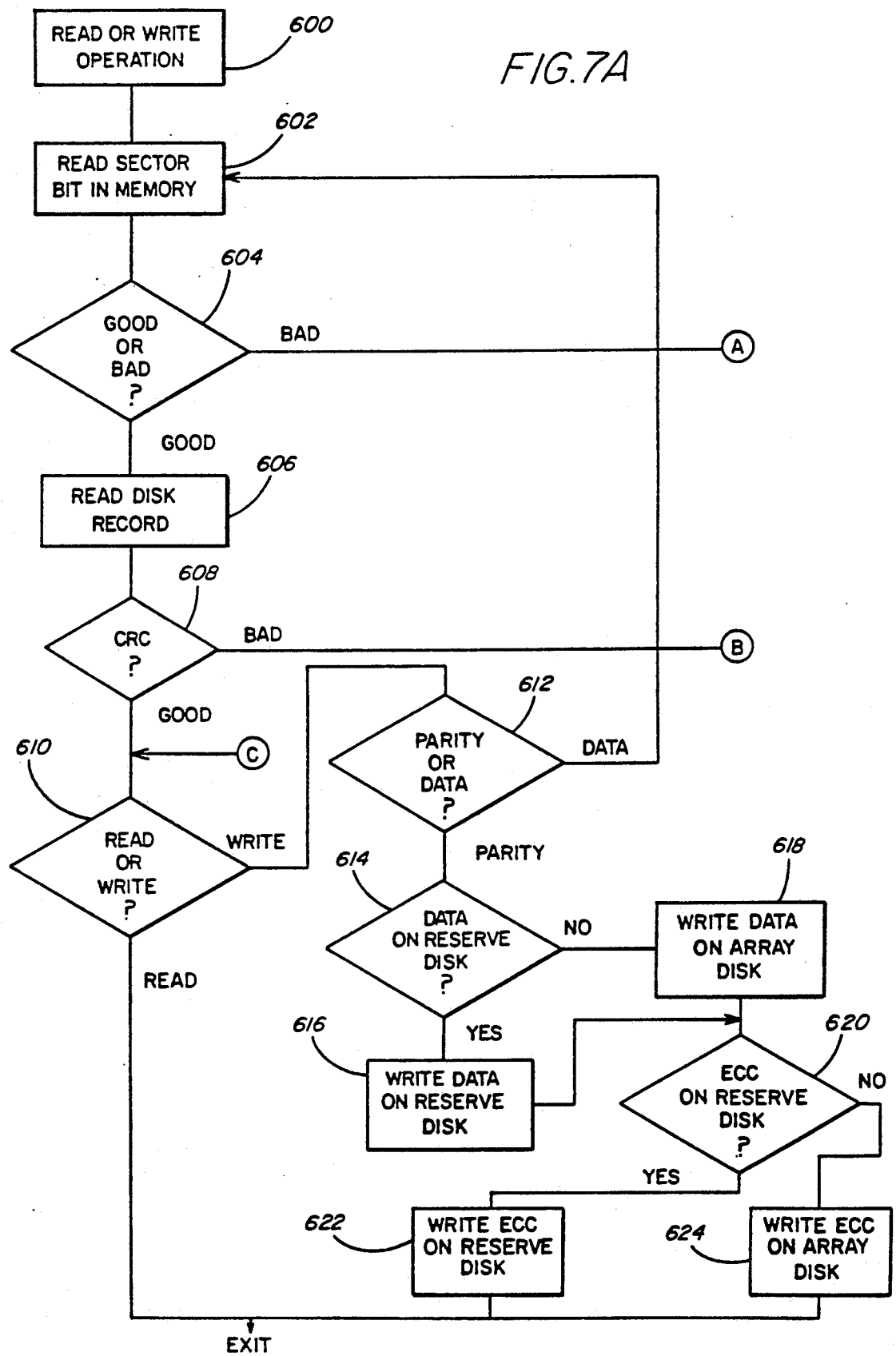
FIGS. 7A and 7B together are a flow chart illustrating the use of a sector bitmap in the system of FIG. 1.
Figure 7B:
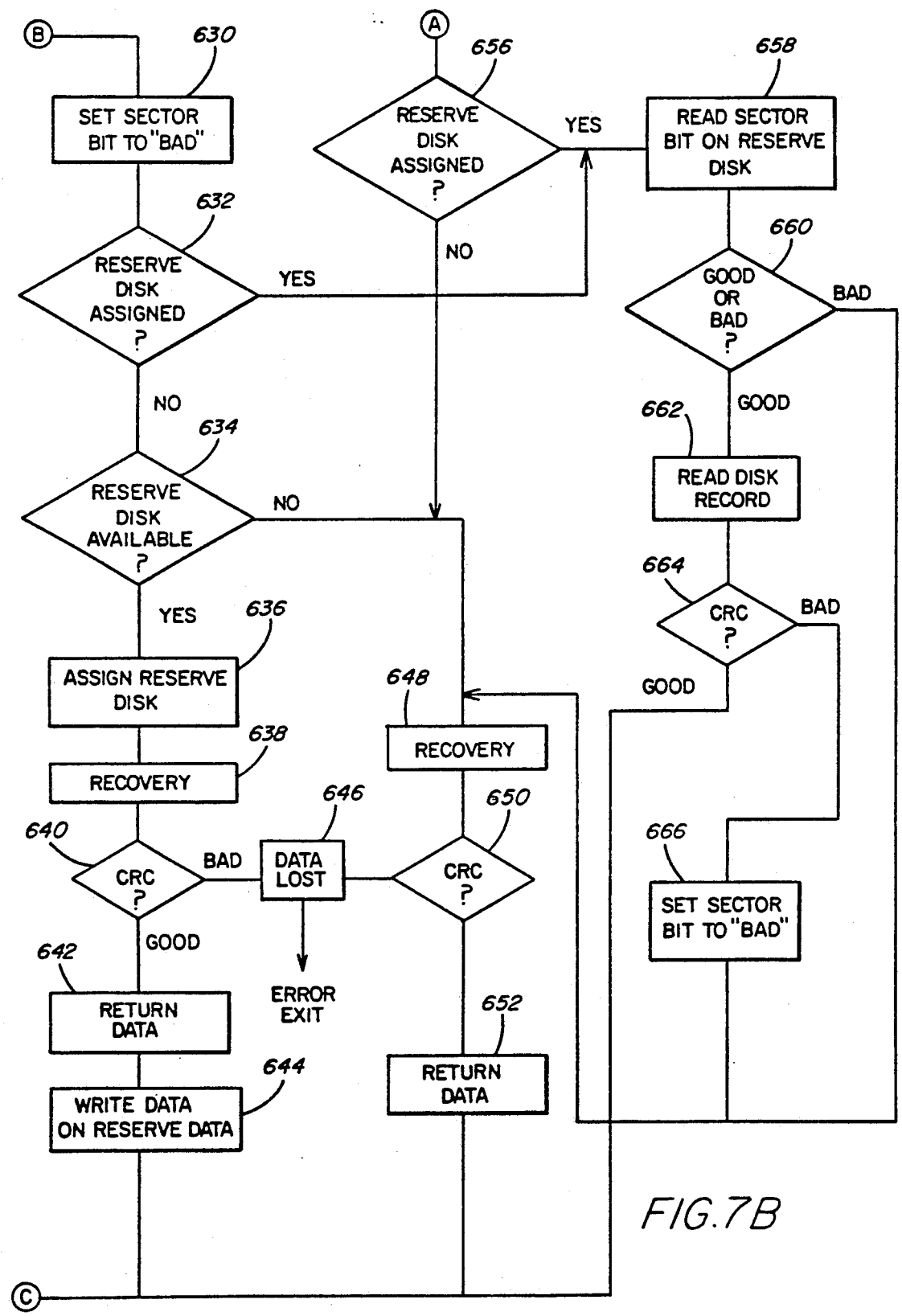

Reference is now made to FIGS. 6 and 7 which together illustrate another embodiment of the present invention using bitmaps in the computer memory. Using bitmaps in a Random Access Memory (RAM) memory which contain information about which sectors on a disk are good or bad provides a further performance enhancement to the present invention. It is much faster to access bits in a RAM memory that have been correlated with respective disk sectors to find out if a disk sector is good or bad than to access the disk itself because the access time due to mechanical performance limitations of a disk drive is much longer than the time needed to access an electronic memory. Further, this approach can eliminate even more disk accesses by allowing the operating system to determine whether the data that is being requested is in the array of storage disks or is already on the "reserve" disk without having to first access the disks.

FIG. 6 shows, in block diagram form, a disk sector bitmap 580 included in the present invention. Bitmap 580 is connected to disk system controller 582 via control and data lines 584. The disk system controller is connected to the disk array 586 including the "reserve" disk subsystem as described in connection with FIG. 1. The disk sector bitmap is usually random access memory and in fact may be a portion of the computer system s main memory. In the sector bitmap, one bit is used to represent each sector on each disk in the array. Consequently, there will be as many bits in the sector bitmap as there are sectors in the disk array. To initialize the sector bitmap, all of the bits are set to indicate that all of the sectors on all of the disks in the disk drive array are good. For example, this may mean setting all of the bits in the sector bitmap to logic 1.

Thereafter, whenever the system performs a read or a write operation, before the system attempts to retrieve any data from or write any data to the array of disk drives, the system will first check the sector bitmap in order to determine whether or not the particular sector that is to be accessed is known to be good or bad. Referring now to FIG. 7, at step 600, the system begins a read or write operation. Next, in step 602, the system reads the sector bit that is associated with the particular sector on the disk drive in the sector bitmap memory. Next, in step 604, the system checks to see whether the sector bit indicates that the sector on the disk is good or bad (i.e., if the sector bit is 1 or 0). If the answer in step 604 is yes, indicating that the particular sector that is going to be accessed is good, the system proceeds to step 606 in which the system reads the particular disk record of interest. Next, in step 608, a CRC check is performed in order to determine whether or not the data read in step 606 is good. If the answer is yes in step 608, that is, that the data record read in step 606 is good, the system proceeds to step 610. In step 610, the system determines whether or not it is performing a read or a write operation. If the system is performing a read operation, after step 610, the routine ends. On the other hand, if the answer in step 610 indicates that the system is performing a write operation, the system proceeds to step 612 in which it determines whether or not it is reading the data record or the parity record associated with the particular disk record to be written. If the answer in step 612 indicates that only the data record has been read, the system loops back to step 602 and proceeds to read the parity record in the same manner as the data record was read.

On the other hand, if the answer in step 612 indicates that the both the data record and parity record have been read, the system proceeds to step 614. In step 614, the system checks to see whether the data record is located on the "reserve" disk or not. If the answer in step 614 is yes, indicating that the data of interest is located on the "reserve" disk, the system proceeds to step 616 in which the data record is written to the "reserve" disk. On the other hand, if the answer in step 614 is no, indicating that the data of interest is not on the "reserve" disk, the system proceeds to step 618 in which the system writes the data record to the normal disk drive in the array.

From step 618 or step 616, the system proceeds to step 620 in which the system determines whether or not the parity record is on the "reserve" disk or the array disk. If the answer in step 620 is yes, the system proceeds to step 622 in which it writes the parity record on the "reserve" disk. On the other hand, if the answer in step 620 is no, indicating that the parity record is not on the "reserve" disk, the system proceeds to step 624 in which the parity record is written on the proper disk drive in the array. After steps 622 or 624, the routine ends.

Returning to step 608, if the CRC check indicates that the data or parity record read in step 606 is bad, the system proceeds to step 630. In step 630, the sector bit representing that particular sector on the disk drive is set to indicate that the sector is now bad (i.e., set to logic "0"). Thereafter, any succeeding operation which attempts to access this particular sector will be avoided since the sector bitmap will indicate that the sector is not functional. From step 630, the system proceeds to step 632 in which a check is made to determine whether or not the "reserve" disk has been assigned. If the answer is no in step 632, the system proceeds to step 634 in which the system checks whether or not the "reserve" disk is available. If the "reserve" disk is available, the system proceeds to step 636 in which the "reserve" disk is assigned to the disk that has the defective sector. Next, in step 638, the system recovers and reconstructs the data as described previously. From step 638, the system proceeds to step 640 in which a CRC check is made of all the disk reads performed in step 638 to determine if any of the data is bad. If the answer in step 640 indicates that all the data read and recovered in step 638 is good, the system proceeds to step 642 in which the data is then transmitted to the computer system. Next, in step 644, the reconstructed data is then stored on the "reserve" disk. When this data is accessed again, the sector bit map will indicate that the sector on the disk drive normally assigned to contain this data is bad and consequently, the system will proceed immediately to the "reserve" disk to obtain the data. After step 644, the system proceeds to step 610 and processing continues as previously described.

Returning to step 640, if the answer in step 640 indicates that one or more of the records read in step 638 is bad, the system proceeds to step 646 in which it sends a message to the computer system indicating that data could not be recovered and may be lost. After step 646, the program ends.

Returning to step 634, if the answer in step 634 indicates that the "reserve" disk is not available (as in the case where there is no "reserve" disk or where the "reserve" disk has already been assigned), then the system proceeds to step 648.

Processing in steps 648-652 proceeds in accordance with the processing already described in connection with steps 638-642 which recovers and returns the data if possible. After step 652, the system proceeds to step 610 and processing proceeds as previously described.

Returning to step 604, if the sector bitmap indicates that the particular sector is bad, the system proceeds to step 656. In step 656, a check is made to determine whether or not the "reserve" disk has been assigned to this disk experiencing the error. If the answer is no in step 656, then the reserve disk does not contain this record and the system proceeds to step 648 and processing continues as previously described.

If on the other hand, the answer in step 656 is yes, indicating that the "reserve" disk has been previously assigned to this disk, or the answer in step 632 is yes, indicating again that the "reserve" disk has been previously assigned to the particular disk in question, then the system proceeds to step 658. In step 658, the system reads the sector bit map for the "reserve" disk to determine in step 660, whether the sector bit indicates the sector on the "reserve" disk is good or bad. If the result of step 660 indicates that the sector on the "reserve" disk is bad, the system proceeds to step 648 which recovers and returns the data if possible and processing proceeds as previously described.

If on the other hand, the answer in step 660 indicates that the sector on the "reserve" disk is good, the system proceeds to step 662 in which the data is read from the "reserve" disk record. From step 662, the system proceeds to step 664 in which a CRC check is performed to determine if the data read in step 662 is good. If the answer is yes in step 664, indicating that all of the data read in step 662 is good, the system proceeds to step 610 and processing continues as already described. On the other hand, if the answer in step 664 indicates that the data read in step 662 is bad, the system proceeds to step 666 in which the sector bit in the sector bitmap memory is set to indicate a bad sector (i.e., logic "0"). From step 666, the system proceeds to step 648 which recovers and returns the data if possible and processing continues as previously described.

Figure 8:
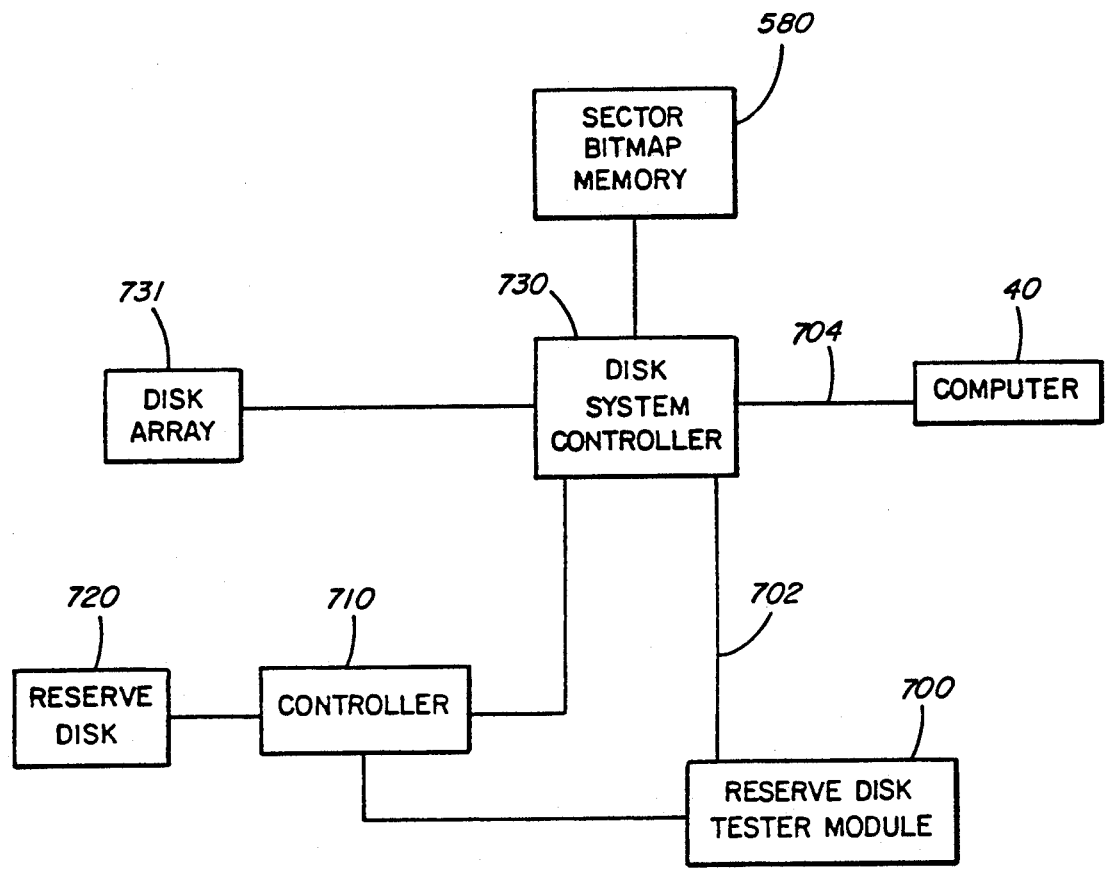
FIG. 8 is a schematic block diagram showing a "reserve" disk tester module connected to the disk drive array of FIG. 1.
Figure 1:
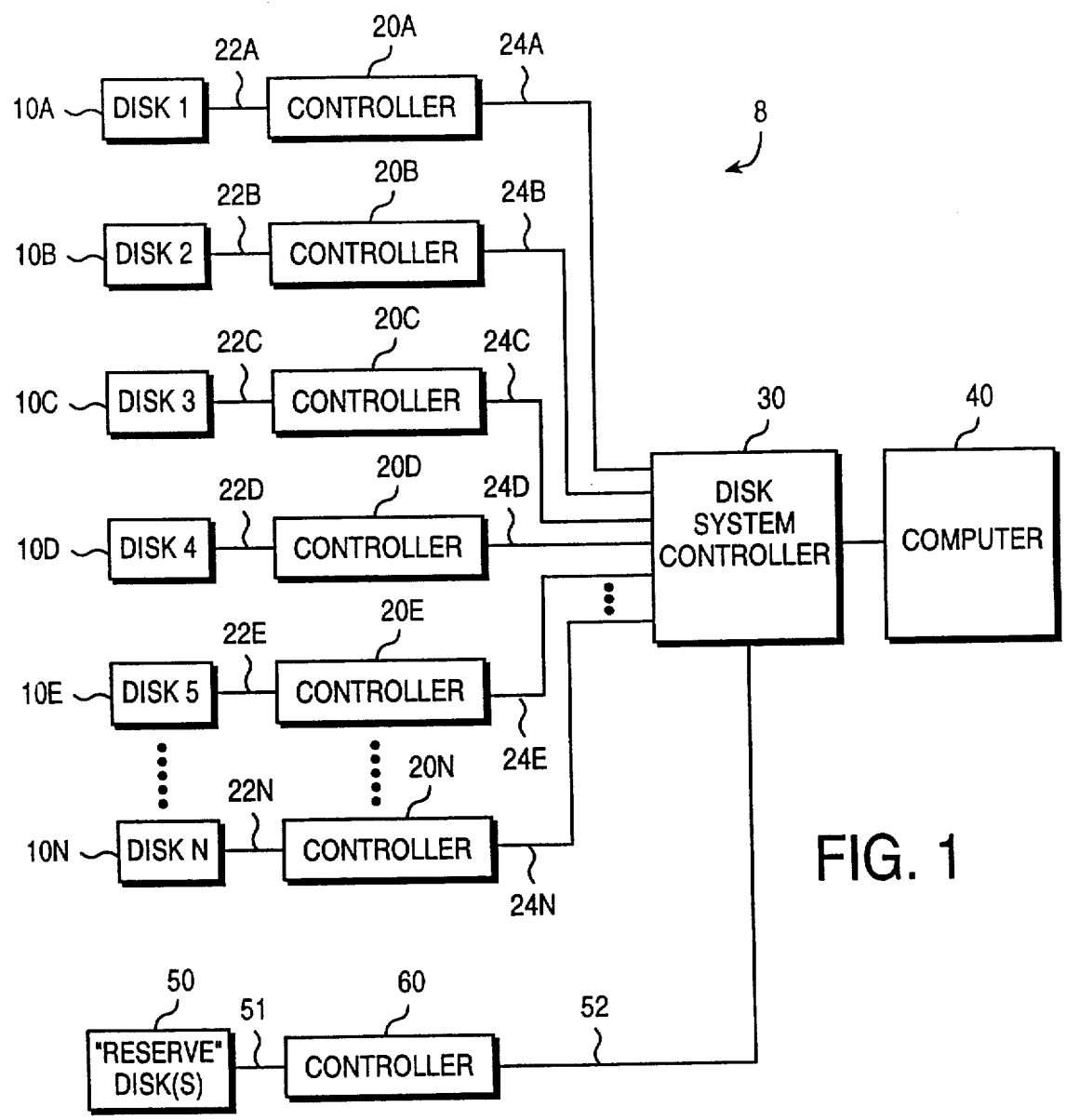
Figure 2:
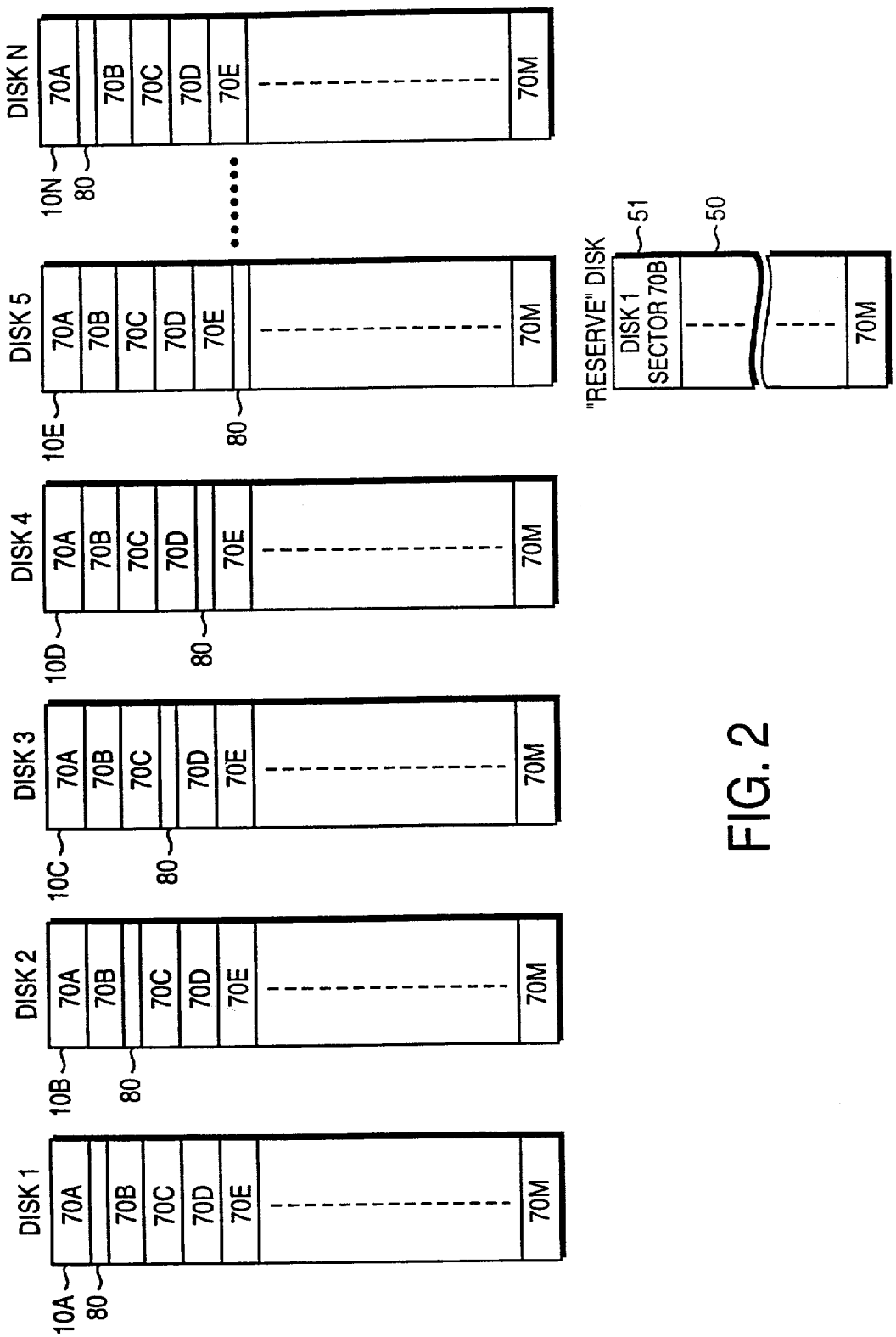
Figure 3:
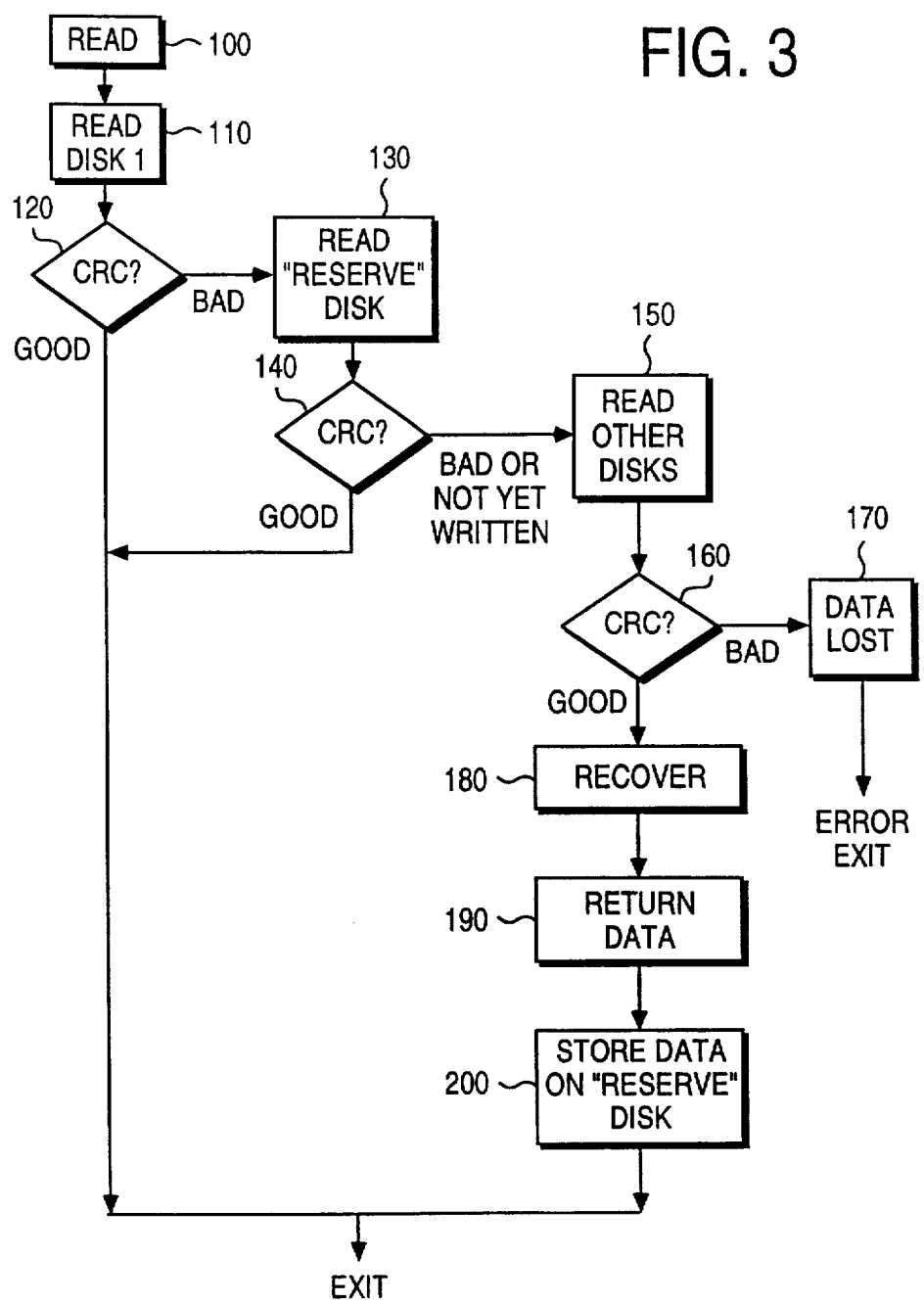
Figure 4A:
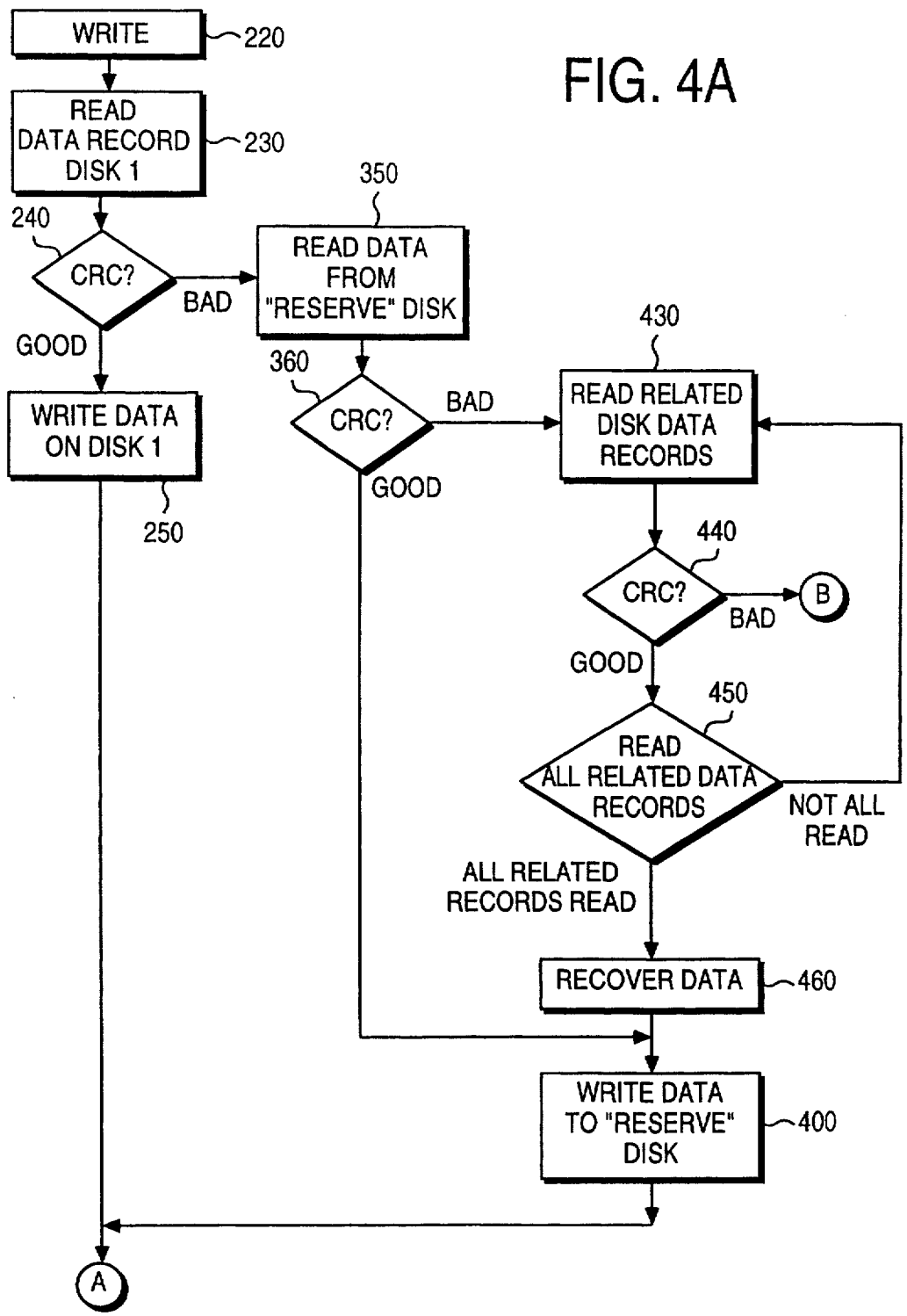
Figure 4B:
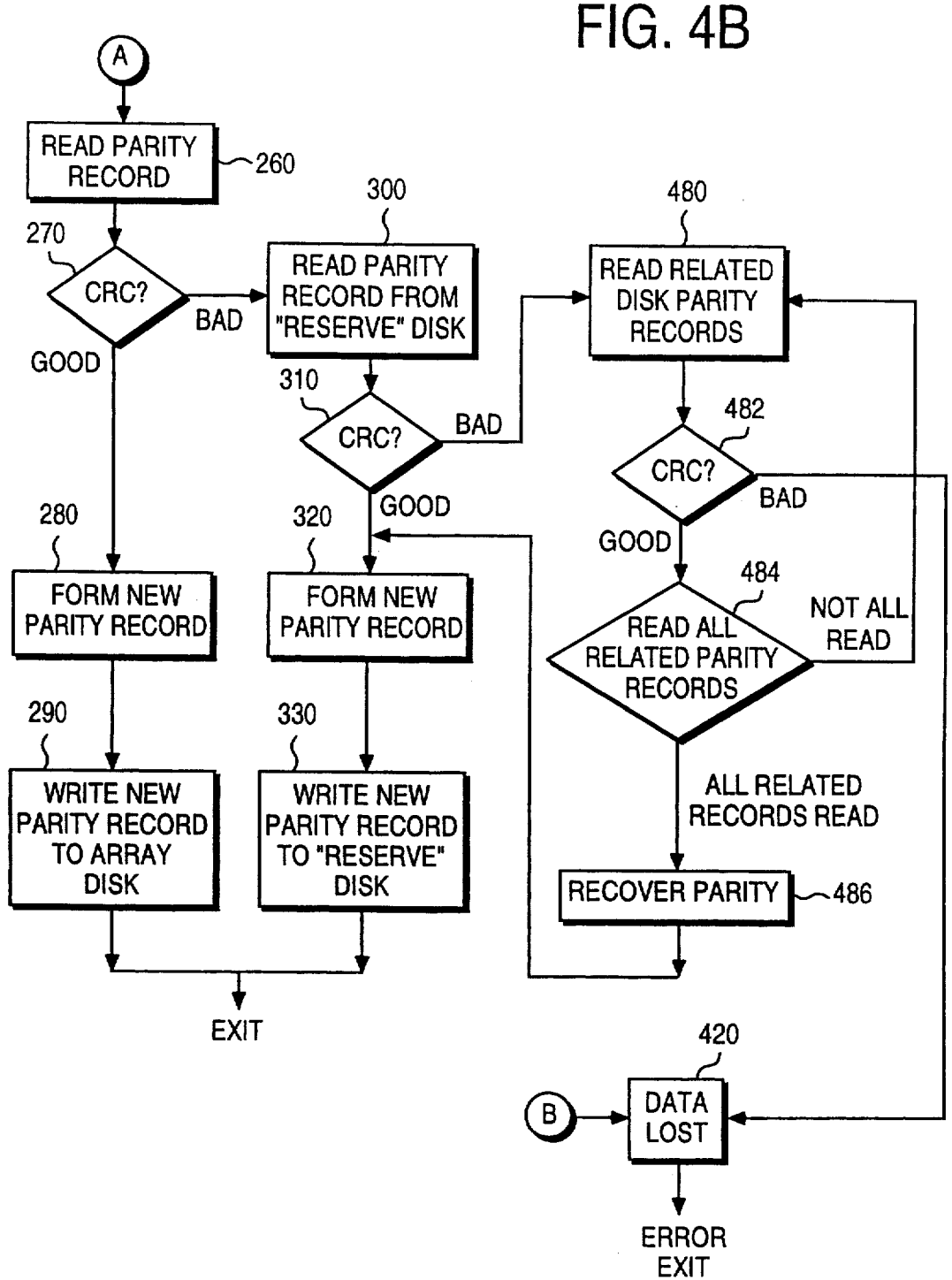
Figure 5A:
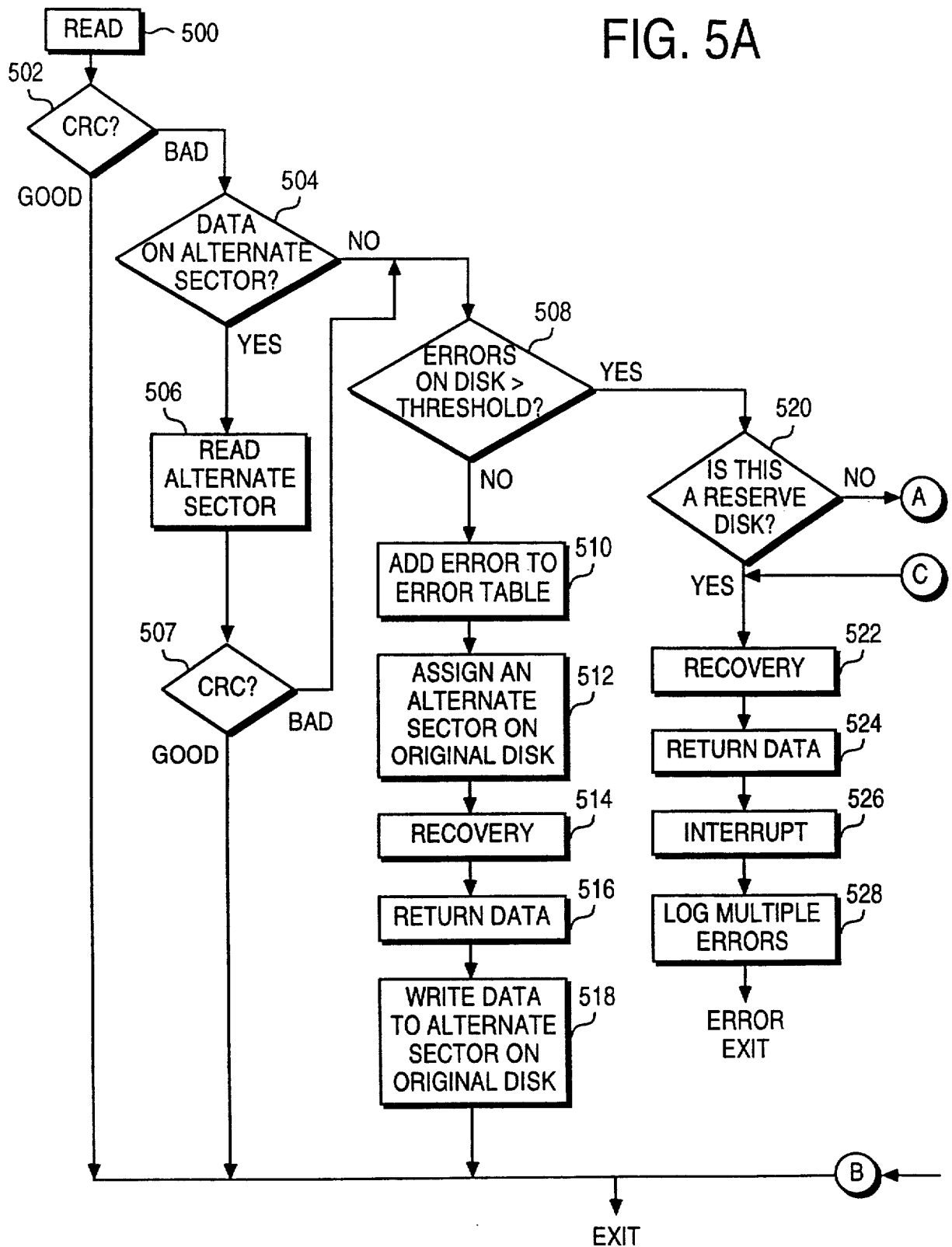
Figure 5B:
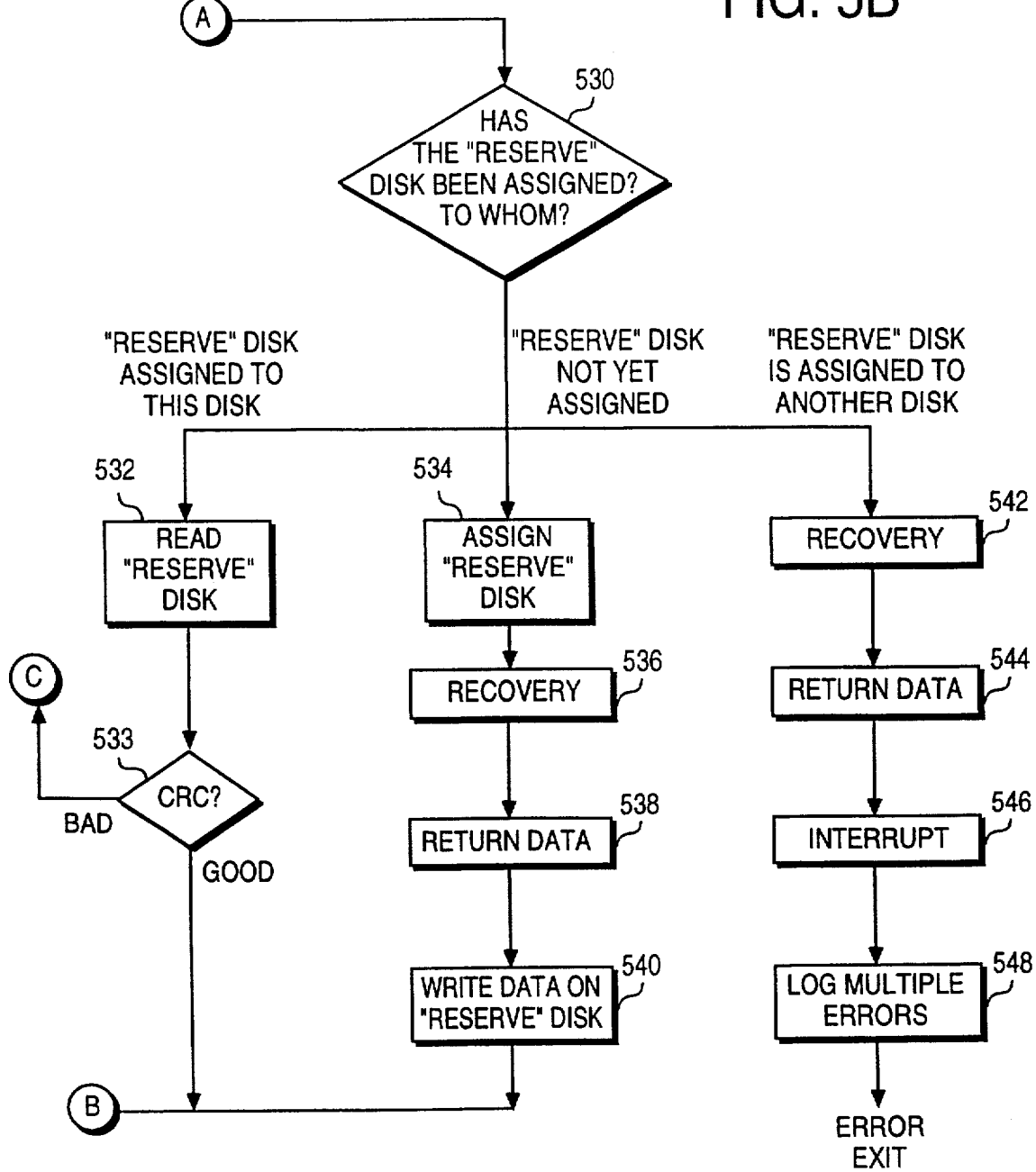
Figure 6:
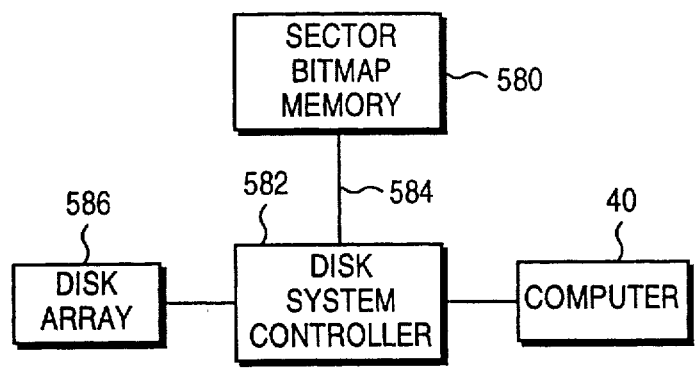
Figure 7A:
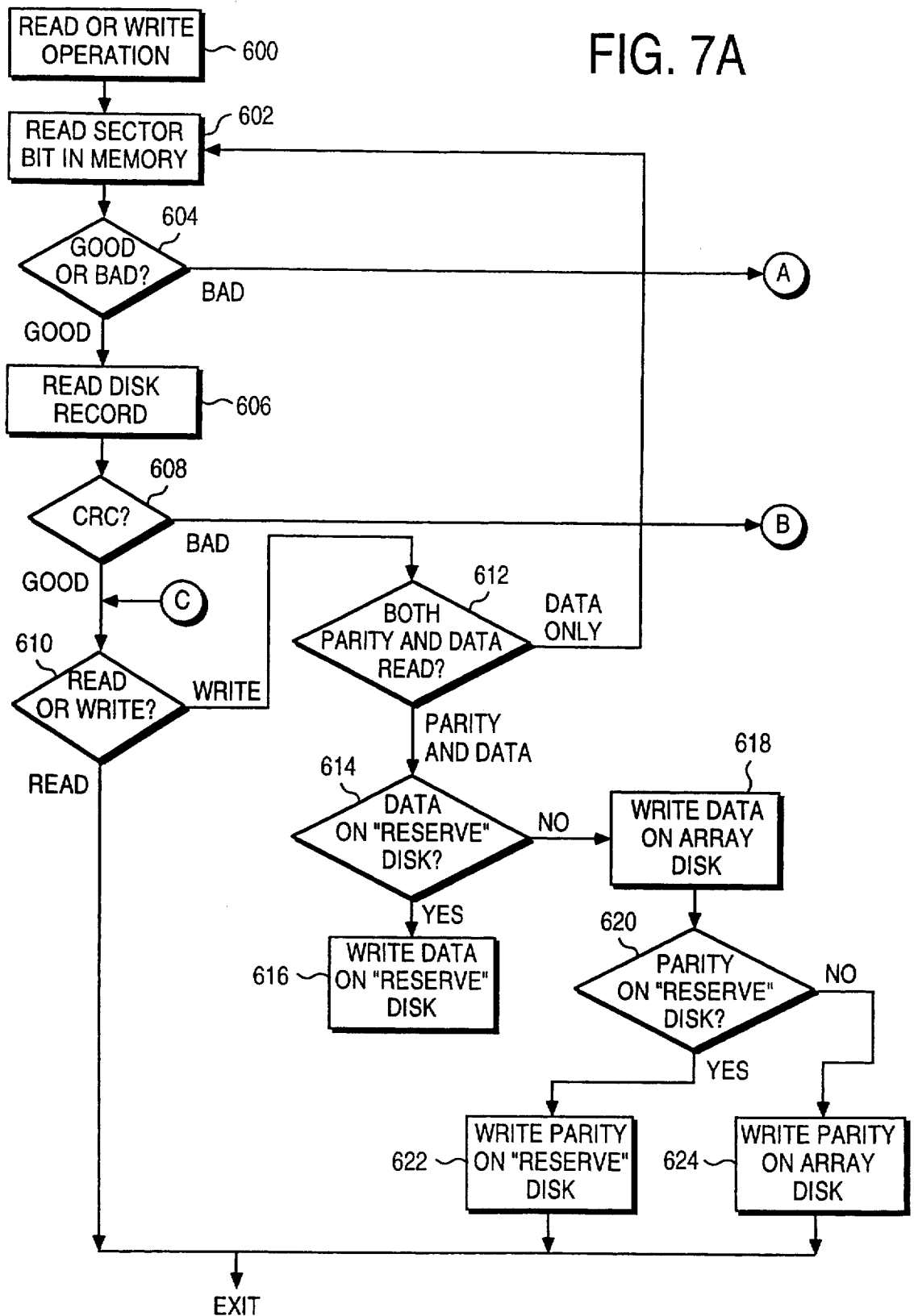
Figure 7B:
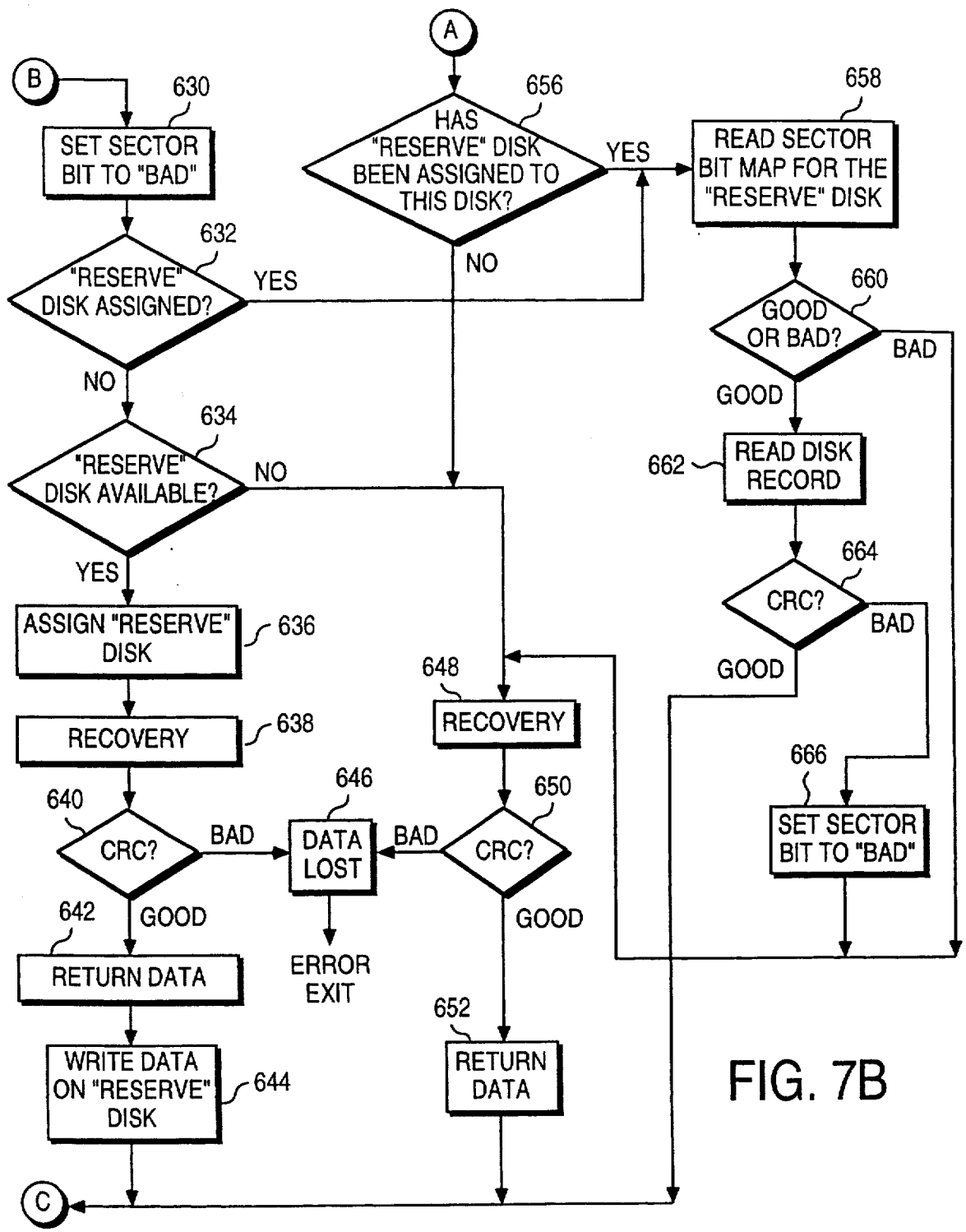
Figure 8:
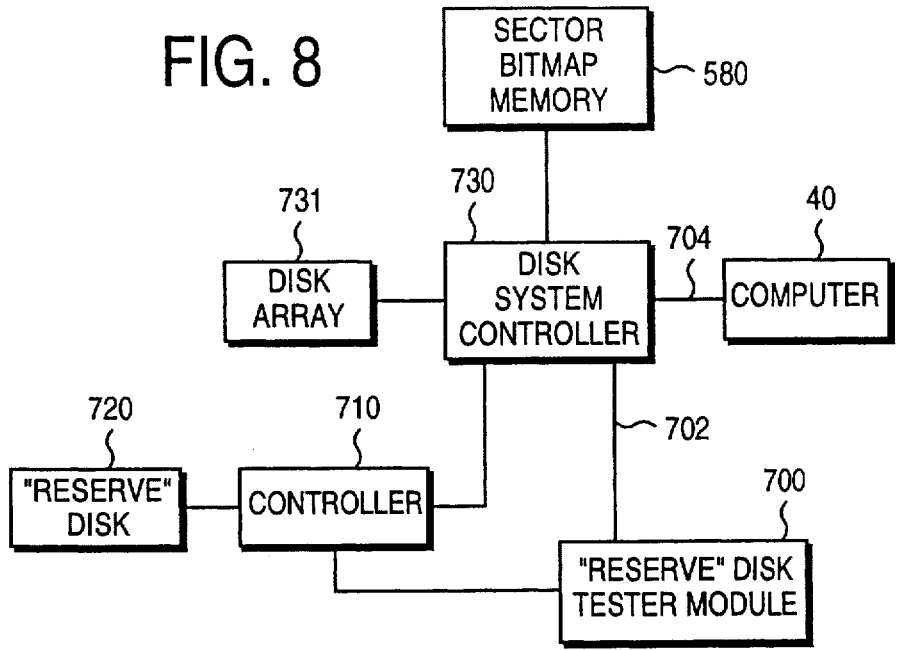

Referring now to FIG. 8, there is shown a "reserve" disk tester module 700 coupled to the disk controller 710 for the "reserve" disk 720. Disk controller 710 is also connected to disk system controller 730. Disk system controller 731 is connected to bitmap memory 580 and disk array 731. The function of "reserve" disk tester module 700 is to periodically test the "reserve" disk in order to determine its condition. If the "reserve" disk is in the system but not used for a long period of time, the "reserve" disk tester module 70 will periodically test the "reserve" disk to verify that it is still in operational condition. If the "reserve" disk should begin to experience errors or fail in some other fashion, the "reserve" disk tester module 700 will provide a signal to disk system controller 730 over line 702. Disk system controller 730 will in turn provide a signal to the computer system by line 704 to alert the operator that the "reserve" disk is experiencing errors and needs to be replaced. The functions performed by disk tester module 700 may be implemented in computer hardware or computer software.

Having thus described a limited number of embodiments of the invention, various alterations, modifications, and improvements will readily occur to those skilled in the art. For example, one skilled in the art will realize that the method and apparatus of the present invention is applicable to other disk subsystems and data storage schemes other than the RAID level 5 system that has been described in detail. One skilled in the art will also appreciate that the present invention is useful in bulk data storage subsystems that use storage media other than disks. The present invention may be used with other RAID disk organizations, such as levels 1-4 and may additionally be used in other types of disk storage subsystems. Such alterations, modifications, and improvements are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and equivalents thereto.

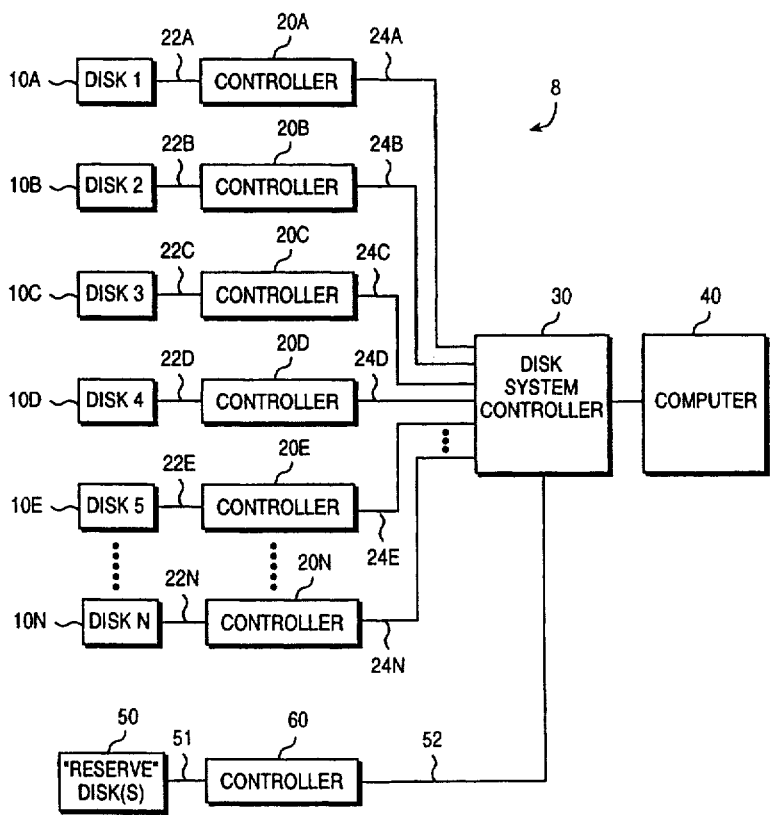

What is claimed is:

1. In a system including an array of disk drives comprising a plurality of disk drives connected to and controlled by a disk system controller, said disk drives having sectors for storing information in a digital format thereon, said information including a combination of digital data and digital redundant information, the redundant information allowing recovery of the digital data if a sector storing at least a portion of the digital information on one of the disk drives is defective, the improvement comprising:
   at least one additional disk drive means intercoupled to the array of disk drives; and
   control means for storing recovered digital data on the at least one additional disk drive means if a sector on one of the disk drives in the plurality of disk drives is defective.

2. The system of claim 1 further comprising means for determining a defective sector.

3. The system of claim 2 wherein said at least one additional disk drive means further comprises a disk drive controller means intercoupled between said at least one additional disk drive means and said disk system controller.

4. The system of claim 1 further comprising:
   a disk drive tester means intercoupled to the disk drive controller means of said at least one additional disk drive means for periodically testing a condition of at least a data storage sector on said at least one additional disk drive means.

5. The system of claim 4 wherein said disk drive tester means is implemented by computer hardware.

6. The system of claim 4 wherein said disk drive tester means is implemented by computer software.

7. The system of claim 4 further comprising means for providing a signal indicating that said at least one additional disk drive means is defective controlled by said disk drive tester means.

8. The system of claim 1 wherein said redundant array of disk drives comprises a RAID Level 5 system.

9. The system of claim 1 further comprising memory means intercoupled to said array of disk drives and to said at least one additional disk drive means, said memory means including a plurality of memory locations each corresponding respectively to a sector in the array of disk drives, each of said memory locations containing information indicating if a sector is defective.

10. The system of claim 9 wherein said memory means comprises random access memory.

11. The system of claim 9 further comprising initializing means for setting the information in each memory location to a known state wherein the known state indicates that a sector is not defective.

12. The system of claim 11 comprising additional control means for changing the state of the information in a memory location upon detection of a respective corresponding defective sector in said array of disk drives.

13. In a system including an array of disk drives comprising a plurality of disk drives connected to and controlled by a disk system controller, said disk drives having sectors for storing information in a digital format thereon, said information including a combination of digital data and digital redundant information, the redundant information allowing recovery of the digital data if a sector storing at least a portion of the digital information on one of the disk drives is defective, a method of storing data on an additional reserve disk comprising the steps of:
(a) providing at least one additional disk drive means intercoupled to the array of disk drives;
(b) determining a defective sector;
(c) recovering data stored on the defective sector; and
(d) storing the recovered data on said at least one additional disk drive means.

14. The method of claim 13 further comprising the steps of:
(a) providing at least one additional sector on a disk drive in the plurality of disk drives that comprise the array said additional sector not being located on said additional disk drive; and
(b) storing the recovered data in said additional sector instead of on said at least one additional disk drive.

15. The method of claim 14 further comprising the step of storing the recovered data on said at least one additional disk drive when said at least one additional sector has data stored therein.

16. The method of claim 13 further comprising the step of periodically testing a condition of at least a data storage sector on said at least one additional disk drive.

17. The method of claim 13 further comprising the steps of:
(a) providing a memory having a plurality of memory locations each corresponding to a sector in a array of disk drives;
(b) storing in each memory location information indicating the status of the corresponding sector; and
(c) checking a corresponding memory location for the status of the corresponding sector prior to accessing said sector.

18. An apparatus for storing digital data comprising:
(a) a plurality of digital data storage means comprising data storage sectors;
(b) means for detecting a defect in the data storage means wherein the detecting means detects defects in the data storage sectors;
(c) means responsive to the detecting means for recovering the data stored in the defective data storage means;
(d) means responsive to the recovering means for storing the recovered data on one of the data storage means different from the defective data storage means.

19. The apparatus of claim 18 wherein the means for storing the recovered data stores the recovered data in a sector on a separate data storage means.

* * * * *

UNITED STATES PATENT AND TRADEMARK OFFICE
CERTIFICATE OF CORRECTION

PATENT NO. : 5,088,081
DATED : Feb. 11, 1992
INVENTOR(S) : Farr

It is certified that error appears in the above-identified patent and that said Letters Patent is hereby corrected as shown below:

The title page should be deleted to appear as per attached title page.

Please delete drawing sheets 1 of 11 and substitute drawing sheets 1 of 11 as per attached.

Signed and Sealed this

Twenty-seventh Day of April, 1999

Attest:

Q. TODD DICKINSON

*Attesting Officer*　　　*Acting Commissioner of Patents and Trademarks*

United States Patent [19]

Farr

[11] Patent Number: 5,088,081
[45] Date of Patent: Feb. 11, 1992

[54] METHOD AND APPARATUS FOR IMPROVED DISK ACCESS

[75] Inventor: William Farr, Framingham, Mass.
[73] Assignee: Prime Computer, Inc., Natick, Mass.
[21] Appl. No.: 500,729
[22] Filed: Mar. 28, 1990
[51] Int. Cl.⁵ .......................... G11B 7/00; G11B 5/09
[52] U.S. Cl. ...................................... 369/54; 369/59; 369/58; 360/24; 360/47
[58] Field of Search ...................... 371/2.2, 10.2, 10.1; 369/54, 58, 59; 360/22, 24, 27, 47

[56] References Cited

U.S. PATENT DOCUMENTS

| | | | |
|---|---|---|---|
| 4,817,035 | 3/1989 | Timsit | 364/900 |
| 4,849,978 | 7/1989 | Dishon et al. | 371/10.1 |
| 4,903,198 | 2/1990 | Iwasaki | 371/10.2 |
| 4,914,656 | 4/1990 | Dunphy, Jr. et al. | 371/10.2 |

OTHER PUBLICATIONS

A Case For Redundant Arrays of Inexpensive Disks (RAID), by David A. Patterson, Garth Gibson, and Randy H. Katz, Report No. UCB/CSD 87/891, Dec. 1987, Computer Science Division (EECS), Berkeley, California 94720.

*Primary Examiner*—Roy N. Envall, Jr.
*Assistant Examiner*—Nakil Hindi
*Attorney, Agent, or Firm*—Wolf, Greenfield & Sacks

[57] ABSTRACT

In a RAID level 5 disk drive subsystem, one or more additional disk drives, called "reserve" disks are intercoupled to the array of disk drives and a control system is included for storing recovered digital data on the additional disk drive if a sector on one of the disk drives becomes defective. The system reduces the number of disk accesses required to obtain the information stored on the defective sector. Once the information has been recovered, it is then stored on the "reserve" disk. Thereafter, whenever this information is required, the system reads the required information from the "reserve" disk, instead of going through an entire recovery process for the defective sector. Since the recovery process can take a time that is greater than several disk access times, the present invention improves the speed and the availability of data. In another embodiment of the invention, a bitmap memory is used wherein bits in the bitmap memory representing sectors may be set to indicate whether or not sectors are defective. In a further embodiment of the invention, a disk drive tester, which can be embodied in either hardware or software, is incorporated into the apparatus for periodically testing the "reserve" disk.

19 Claims, 11 Drawing Sheets